(12) United States Patent
Horch et al.

(10) Patent No.: US 7,279,367 B1
(45) Date of Patent: Oct. 9, 2007

(54) METHOD OF MANUFACTURING A THYRISTOR SEMICONDUCTOR DEVICE

(75) Inventors: Andrew E. Horch, Sunnyvale, CA (US); Fred Hause, Austin, TX (US)

(73) Assignee: T-Ram Semiconductor, Inc., Milpitas, CA (US)

( * ) Notice: Subject to any disclaimer, the term of this patent is extended or adjusted under 35 U.S.C. 154(b) by 304 days.

(21) Appl. No.: 11/007,510

(22) Filed: Dec. 7, 2004

(51) Int. Cl.
  *H01L 21/332* (2006.01)
(52) U.S. Cl. ............ 438/135; 438/133; 257/107; 257/E27.052
(58) Field of Classification Search ............ 438/135, 438/133, FOR. 140; 257/E27.052, 107
  See application file for complete search history.

(56) References Cited

U.S. PATENT DOCUMENTS

| | | | |
|---|---|---|---|
| 4,876,213 A | 10/1989 | Pfiester | |
| 4,956,311 A | 9/1990 | Liou et al. | |
| 5,126,279 A | 6/1992 | Roberts | |
| 5,399,513 A | 3/1995 | Liou et al. | |
| 5,807,759 A | 9/1998 | Naem et al. | |
| 5,891,771 A | 4/1999 | Wu et al. | |
| 5,902,125 A | 5/1999 | Wu | |
| 5,982,017 A | 11/1999 | Wu et al. | |
| 5,989,950 A | 11/1999 | Wu | |
| 6,001,738 A | 12/1999 | Lin et al. | |
| 6,030,863 A | 2/2000 | Chang et al. | |
| 6,037,204 A | 3/2000 | Chang et al. | |
| 6,110,763 A * | 8/2000 | Temple ............ | 438/133 |
| 6,124,177 A | 9/2000 | Lin et al. | |
| 6,187,619 B1 | 2/2001 | Wu | |
| 6,229,161 B1 | 5/2001 | Nemati et al. | |
| 6,242,785 B1 | 6/2001 | Hossain et al. | |
| 6,258,682 B1 | 7/2001 | Tseng | |
| 6,261,935 B1 | 7/2001 | See et al. | |
| 6,284,613 B1 | 9/2001 | Subrahmanyam et al. | |
| 6,294,415 B1 | 9/2001 | Tseng et al. | |
| 6,326,251 B1 | 12/2001 | Gardner et al. | |
| 6,346,449 B1 | 2/2002 | Chang et al. | |
| 6,350,656 B1 | 2/2002 | Lin et al. | |
| 6,462,359 B1 | 10/2002 | Nemati et al. | |

OTHER PUBLICATIONS

U.S. Appl. No. 10/609,185, filed Jun. 26, 2003, Horch, et al.

(Continued)

*Primary Examiner*—Michelle Estrada
*Assistant Examiner*—Nicholas Tobergte

(57) ABSTRACT

In a method of processing a semiconductor device, a silicide-blocking layer may be formed over a semiconductor material. After defining the silicide-blocking layer, impurities may be implanted into portions of the semiconductor material as defined by the silicide-blocking layer. After the implant, silicide may be formed in a surface region of the semiconductor material as permitted by the silicide-blocking layer. Regions of the impurity implant may comprise boundaries that are related to the outline of the silicide formed thereover. In a further embodiment, the implant may define a base region to a thyristor device. The implant may be performed with an angle of incidence to extend portions of the base region beneath a peripheral edge of the blocking mask. Next, an anode-emitter region may be formed using an implant of a substantially orthogonal angle of incidence and self-aligned to the mask. Epitaxial material may then be formed selectively over exposed regions of the semiconductor material as defined by the silicide-blocking mask. Silicide might also be formed after select exposed regions as defined by the silicide-blocking mask. The silicide-blocking mask may thus be used for alignment of implants, and also for defining epitaxial and silicide alignments.

39 Claims, 14 Drawing Sheets

OTHER PUBLICATIONS

Mark Rodder and D. Yeakley; *Raised Source/Drain MOSFET with Dual Sidewall Spacers*; IEEE Electron Device Letters; Mar. 1991; pp. 89-91; vol. 12, No. 3; IEEE.

Hsiang-Jen Huang; *Improved Low Temperature Characteristics of P-Channel MOSFETs with $Si_{1-x}Ge_x$ Raised Source and Drain*; IEEE Transactions On Electron Devices, vol. 48, No. 8, Aug. 2001, pp. 1627-1632; 0018-9383(01)05680-5 2001 IEEE.

T. Ohguro; *High Performance RF Characteristics of Raised Gate/Source/Drain CMOS with Co Salicide*; Symposium on VLSI Technology Digest of Technical Papers; 0-7803-4700-6/98 1998 IEEE.

Yang-Kyu Choi; *Nanoscale Ultrathin Body PMOSFETs With Raised Selective Germanium Source/Drain*; IEEE Electron Device Letters; Sep. 2001; vol. 22, No. 9, pp. 447-448; 0741-3106(01)07740-0 2001 IEEE.

N. Lindert; *Quasi-Planar FinFETs with Selectively Grown Germanium Raised Source/Drain*; 2001 IEEE International SOI Conference; Oct. 2001; pp. 111-112; 0-7803-6739-1/01 2001 IEEE.

K. De Meyer; *Raised Source/Drains with Disposable Spacers for Sub 100 nm CMOS Technologies*; Extended Abstracts of International Workshop on Junction Technology 2001; pp. 87-90; ISBN 4-89114-019-4/020-8; 2001 Japan Society of Applied Physics.

\* cited by examiner

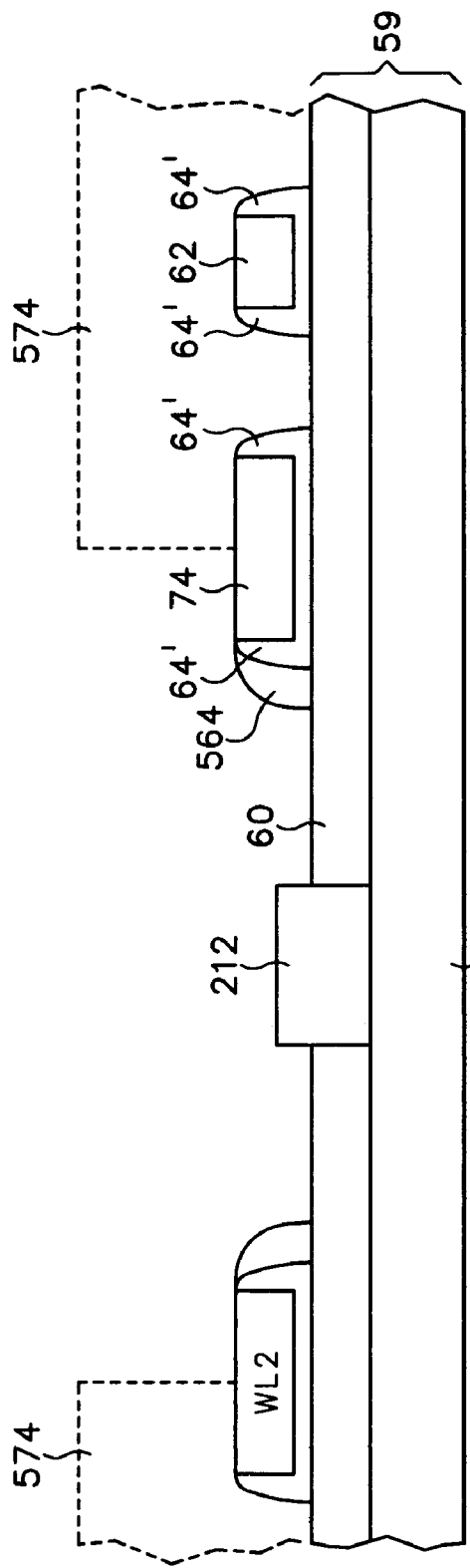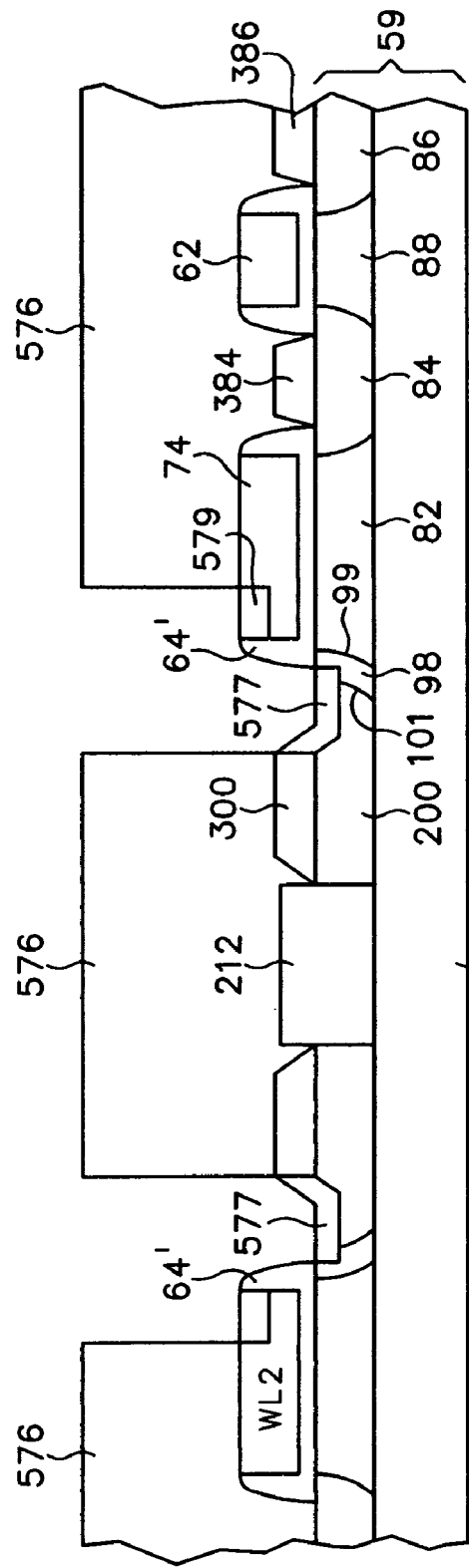
FIG.13A
FIG.13B

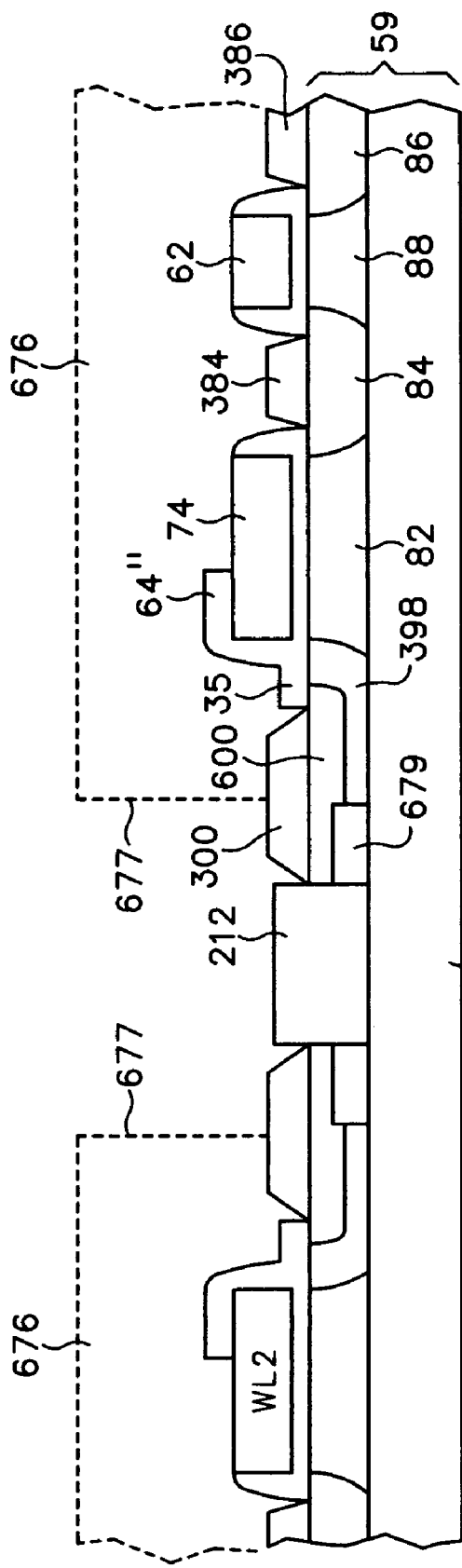
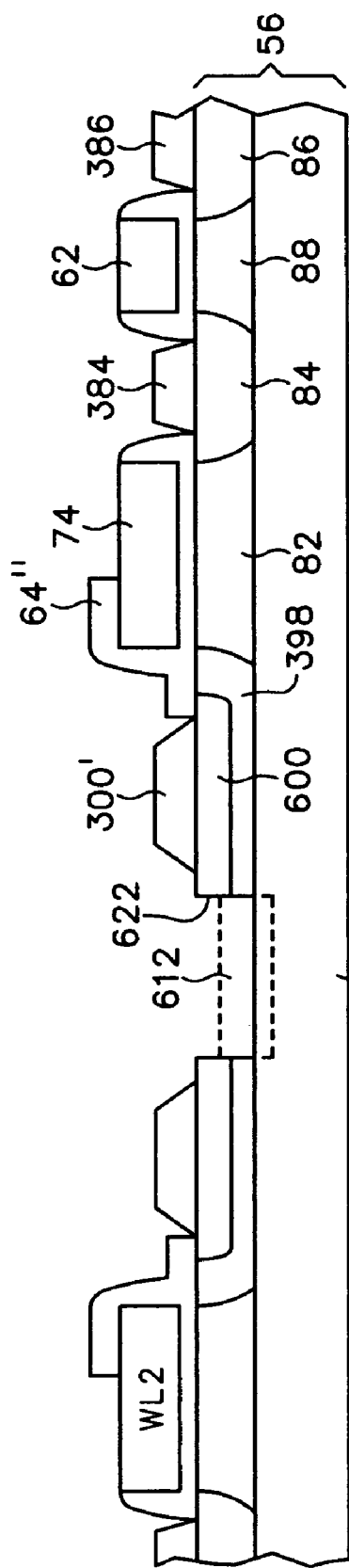
FIG.14
FIG.15

METHOD OF MANUFACTURING A THYRISTOR SEMICONDUCTOR DEVICE

REFERENCE TO RELATED APPLICATIONS

This application claims benefit and priority to U.S. patent application Ser. No. 10/609,185, filed Jun. 26, 2003, entitled THYRISTER SEMICONDUCTOR DEVICE AND METHOD OF MANUFACTURE; which claims priority to U.S. Provisional Application Ser. No. 60/415,368, filed Oct. 1, 2002, and entitled IMPLANT APPROACH WITH SELF-ALIGNMENT TO SALICIDE BLOCK; both of which are hereby incorporated by reference in their entirety.

BACKGROUND

The present disclosure is related to semiconductor devices and their methods of manufacture; and, more particularly, to the devices and manufacture of metal oxide semiconductors and thyristors.

The advancement of the semiconductor industry has brought forward devices of smaller geometries and high density for enabling higher levels of integration. Some of these developments have typically required multiple processing steps and procedures, which can affect their production efficiencies and economics.

A common element in a semiconductor device is a transistor, such as a metal-oxide-semiconductor field-effect transistor (MOSFET). These MOSFETs can be interconnected to other elements on a substrate to form part of an overall electrical circuit such as a memory, a control unit, a network device, a processor or handheld electrical product etc. As the dimensions of these MOSFETs shrink, they can become more vulnerable to source to drain leakage in the semiconductor region under the gate oxide. This leakage can be due to punch through or sub threshold leakage. One method to reduce these leakage mechanisms is to use a Silicon On Insulator (SOI) substrate such as a layer of silicon on oxide where the silicon layer may be thin enough such that a bias of a gate electrode may be capable of fully depleting the silicon layer. Such devices may be described as fully depleted SOI.

One technique that can be used to guard against the breakdown or device degradation from hot carrier injection (HCI) of a gate oxide for a MOSFET is the formation of drain/source extension(s), known alternatively as lightly doped drain (LDD) regions. These regions can be formed in an upper surface region of the semiconductor material and/or with lighter doping than the source drain regions of the MOSFET and may extend laterally beneath the gate and between the channel and their respective source and drain regions. For example, such devices may comprise relative concentration differences as may be presented by S/D regions of concentrations in the Xe20 range, LDD regions with concentrations from about Xe18 to Xe19 and channel regions with concentration of about Xe17. During operation of such MOSFET, the resistance of the extension regions can provide voltage drops along their length that may be sufficient to enable the MOSFET to withstand higher voltage operation.

Another contribution to the evolution of smaller geometry devices has been the advent of silicon-on-insulator technology. MOSFETs formed on conventional Silicon-on-insulators (SOI) exhibit lower parasitic junction capacitance, greater on/off isolation and better sub-threshold swing in comparison to their equivalent bulk counterparts. With these performance advantages, the SOI devices can perform with lower power, higher speed and improved switching characteristics.

For SOI MOSFETs, it may be desirable to form a thin silicon layer for the channel regions so that the channel region may be fully depleted. At the same time, there may be an opposing desire, to enhance the thickness of their source and drain regions for lower resistance. The thicker the source drain regions the thicker the salicide layer formed on them can be. The thicker the salicide layer the lower the salicide resistance. To accommodate these dual objectives for a thin channel region and thicker source drain regions, raised structures may be formed over the source/drain regions. These raised source and drain structures may be formed through either the use of epitaxial deposition or trench formations for recessed gates. By elevating the source and drain regions, metal diffusion during silicide formation need not consume their full thickness. Typically the silicide, epitaxial deposition and implant processes might each be performed using separate patterning provisions. They may be patterned for placing silicide and/or epitaxial material offset from the source/drain extension regions. By such offset, manufacturing tolerances may be accommodated during their fabrication such that the silicide and/or epitaxial material might not overlap the extension regions. Accordingly, it may be noted that an overall length of a MOSFET could thus be limited by the manufacturing tolerances of the various mask patternings associated with the separate silicide, epi and/or implant masks.

In the case of fabricating thin capacitively coupled thyristor (TCCT) devices, there may be a need to silicide the anode/cathode-emitter regions. Additionally, an electrode over one of the base regions might need to be formed with an offset relative to its other base region. Such offset may allow operation of the electrode with reduced likelihood of gate induced leakage (GIDL) effects relative to the offset base region. Typically, fabrication of the offset base might require separate masking provisions to assure its offset relationship relative to the gate electrode. Additionally, silicide patterning might also use its own masking provisions for forming the silicide with clearance from the electrode and the base regions. For if the salicide were to overlap two thyristor regions, the shorting by the silicide could destroy thyristor operation.

It may be noted that these separate patterning and masked provisions for the source/drain extensions, silicide and/or epi structures for a MOSFET, may each add to the complexity, cost and size of the overall device. Likewise, it may be noted, that the separate mask provisions for definition of the offset base, the emitter silicide and/or the epi structures for the thin capacitively coupled thyristor may similarly add to its overall complexity, cost and size.

SUMMARY

In accordance with embodiments of the present invention, dielectric may be patterned as a mask and may be used repetitively for defining source/drain extension regions for a MOSFET and also for defining silicide and/or epitaxial structures.

In other embodiments, the formation of a capacitively coupled thyristor may similarly use a common mask for defining a base region silicide, epitaxial structure and/or leakage implant.

In one embodiment, a semiconductor device may comprise silicide disposed on a layer of semiconductor material. Impurities may be formed in a region of the layer of semiconductor material. The silicide over the layer of semiconductor material may comprise an outline related to patterning of the impurities. In a further embodiment, the silicide may have a peripheral edge that is aligned with relationship to a lateral extent of a doped region defined by the patterning of the impurities.

In a further embodiment, a shallow implant extension region may be formed in a layer of semiconductor material in contiguous relationship with a deep level implant region. The interface therebetween may define an outline that is related to the peripheral edge as defined for the silicide.

In accordance with yet a further embodiment, a semiconductor device may further comprise a gate electrode over the layer of semiconductor material and a silicide blocking material on a region of the semiconductor material between the silicide and the gate electrode. The silicide blocking material may extend laterally outward from the gate electrode to meet a peripheral edge of the silicide. The silicide blocking material may protect a surface of the shallow implant region and a portion of the deep level implant across the interface with the shallow implant region.

In another embodiment, a transistor comprises source and drain regions of first conductivity type with a channel of second conductivity type between the source and drain regions. A gate electrode may be disposed over the channel region and operable under bias to affect an electric field in the channel region. At least one source and drain extension region of first conductivity type may extends laterally between the source/drain region and the channel region. The source/drain region may comprise dopant of the first conductivity type and may be contiguous with its respective extension region. In particular embodiments, the source/drain region may be more heavily doped than the extension region. Further, the source/drain region may be offset laterally from the outline of the gate electrode and the silicide thereover may comprise a peripheral edge that is laterally offset from a boundary between the source/drain region and the extension region. In a particular embodiment, a peripheral edge of the silicide meets a surface of the source/drain region and a spacer might also be formed against a sidewall of the gate electrode to serve as a silicide-blocking layer. Such silicide-blocking layer may be disposed with a lateral extent over the extension region.

According to another embodiment, a method of processing a semiconductor device may comprise patterning a silicide-blocking layer over semiconductor material. After implanting a select region of the semiconductor material, a metal may be formed over exposed regions of the semiconductor material and a portion of the metal diffused into a surface layer of the semiconductor material as defined by the patterned silicide-blocking layer. In a particular embodiment, the implanting may comprise a first implant to place first impurities into a first region of the semiconductor material and to define a thyristor base region in accordance with patterning of the silicide-blocking layer. The implanting might also comprise a second implant to place second impurities into a second region of the semiconductor material to define an emitter region of the thyristor next to the base region. The extent of the first region may be defined by the patterned salicide-blocking layer and at least one of the implant energy, implant angle, and species of implant associated with the first impurities. The second region may be defined by the patterned salicide-blocking layer and at least one of the implant energy, implant angle and species associated with the second impurities implant. At least one of the implant energy, implant angle and species of the second impurity implant may differ from that of the first impurities implant. This may result in the implant or implants being self aligned to the salicide blocking material.

In a further aspect, the implant for the first impurities may comprise an angled implant to implant regions of semiconductor material beneath a portion of the patterned salicide blocking layer. Additionally, a substantially orthogonal implant may be used for the second impurities implant.

In a further aspect, the first region of the first implant species may be defined to extend laterally in the layer of semiconductor material to a position beneath the salicide blocking layer but laterally clear of the region beneath the outline of the gate electrode.

In accordance with another embodiment of the present invention, a semiconductor device may comprise a layer of semiconductor material with a plurality of regions of alternating first and second opposite conductivity-types disposed therein. One region of the plurality of regions comprises an anode-emitter and another region may comprise a cathode-emitter. The cathode-emitter may comprise an N-type conductivity and the anode-emitter may comprise a P-type conductivity. At least two regions of the plurality of regions may be disposed between the anode-emitter and the cathode-emitter. The anode-emitter may define a junction where it meets one of the at least two regions. A first electrode may be disposed over at least one of the regions between the anode and the cathode-emitters. Epitaxial material may be disposed over one of the cathode-emitter and/or anode-emitter regions and may be offset laterally clear of the junction of the anode and/or cathode-emitter region(s) at the surface of the layer of semiconductor material.

In another embodiment, the anode-emitter, the cathode-emitter, and the at least two different regions of alternating regions therebetween define a thyristor having a surface region thereof that is free of silicide between a peripheral edge of the epitaxial material over the anode-emitter and a peripheral edge of the first electrode. The silicide free surface may further overlap a full-width of the first base region and the second base region.

In another embodiment, the semiconductor device may comprise conductive material to propagate a reference voltage to at least one of the anode and cathode-emitters.

In accordance with another embodiment, a memory device may comprise a thyristor formed in a layer of semiconductor material. The thyristor may comprise an anode-emitter, a cathode-emitter, and first and second base regions between the anode-emitter and the cathode-emitter. A first electrode may be disposed over and capacitively coupled to at least a portion of the first base region. The second base region may be offset laterally clear of the first electrode. A raised provision of semiconductor material may be disposed on the layer of semiconductor material and at least one of the anode and cathode-emitters. The raised portion of the anode-emitter may comprise an outline spaced laterally clear from the first base region.

In accordance with another embodiment, a method of forming a thyristor memory device may comprise forming a wordline over a layer of silicon. A conformal layer of silicide blocking material may be formed over the wordline and the layer of silicon and patterned to define a salicide mask comprising a first part over at least a portion of the wordline, a second part contiguous with the first part and conformal to a sidewall of the wordline, and a third part contiguous with the second part as a shoulder that extends outwardly from the wordline and across a portion of the layer of silicon that neighbors the wordline. Dopant of a second type conductivity may be implanted into select regions of the silicon using an acute angle of incidence to penetrate peripheral regions beneath the salicide mask. After the implanting with the second type conductivity dopant, first type conductivity dopant may be implanted in the layer of silicon using a substantially orthogonal angle of incidence to penetrate regions self-aligned with the salicide mask.

BRIEF DESCRIPTION OF THE DRAWINGS

Subject matter of embodiments of the present invention and methods of fabrication may be understood by reference to the following detailed description when read with reference to the accompanying drawings, in which:

FIGS. 13A through 13B are cross sectional views showing a portion of a semiconductor substrate in two different stages of processing useful to describe a method of fabricating a thyristor memory in accordance with an alternative embodiment of the present invention, and showing a sacrificial element to define patterning of base region and to affect alignment of impurity lifetime adjustment species.

FIG. 14 is a cross sectional view of a portion of a semiconductor substrate during a method of forming a thyristor memory according to another embodiment of the present invention, and showing leakage implant species across an interface between an emitter and base of the thyristor.

FIG. 15 is a cross sectional view showing a portion of a semiconductor substrate during a method of processing a thyristor memory in accordance with yet another embodiment of the present invention, and showing an isolation trench exposing end portions of an emitter and base.

DETAILED DESCRIPTION

Figure 1:
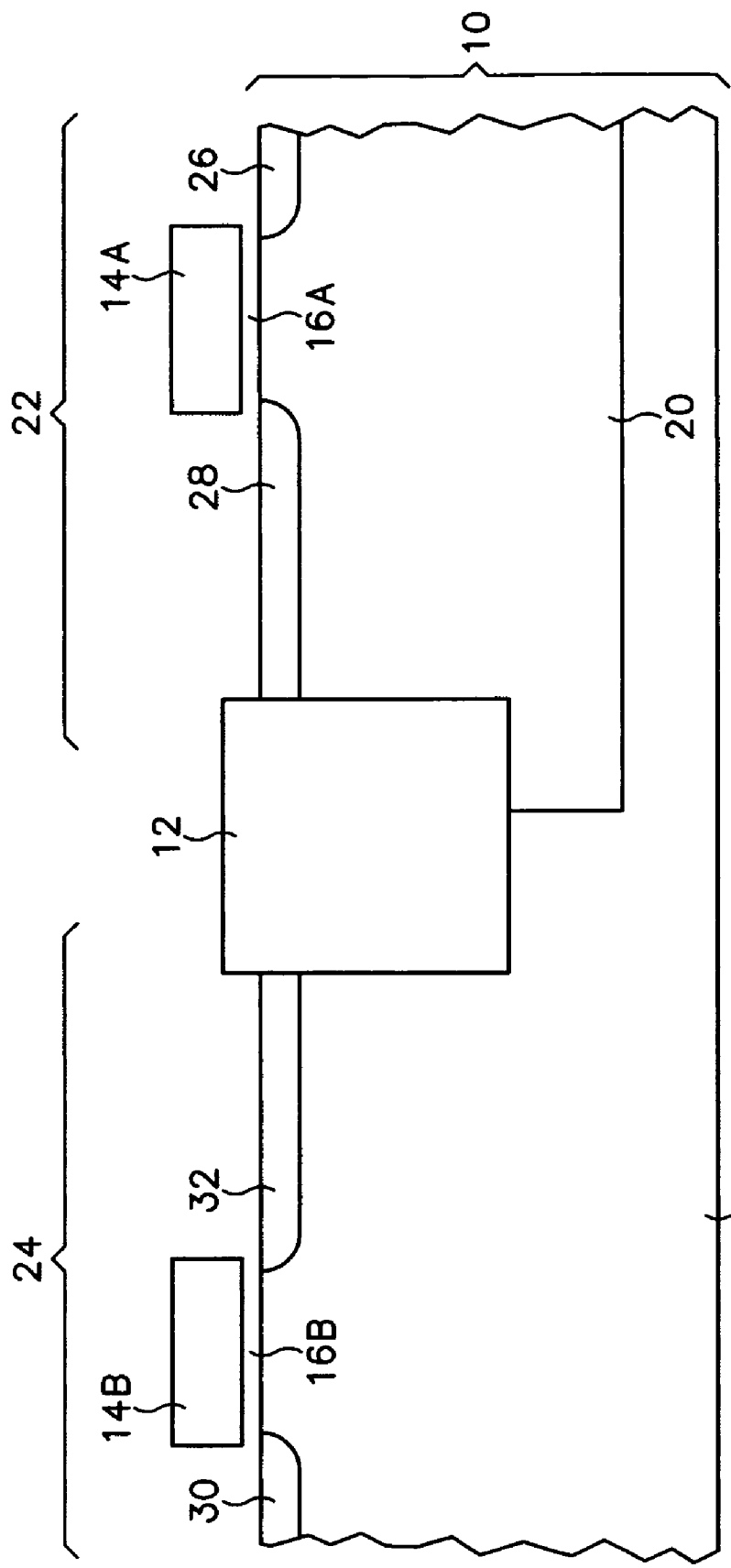
FIG. 1 is a cross-sectional view of a portion of a semiconductor view device during a method of fabrication according to an embodiment of the present invention, showing two separate electrodes over different active regions of the semiconductor substrate.

In the description that follows, numerous specific details may be set forth to provide an understanding of exemplary embodiments of the present invention. It will be understood, however, that alternative embodiments may comprise subcombinations of the disclosed examples. Additionally, readily established circuits and procedures of the exemplary embodiments may be disclosed in simplified form (e.g., simplified block diagrams and/or simplified description) to avoid obscuring an understanding of the embodiments with excess detail. Likewise, to aid a clear and precise disclosure, description of known processes—e.g., formation of sidewall spacers, photoresist and mask patterning, etc.—may similarly be simplified where persons of ordinary skill in this art can readily understand their structure and formation by way of the drawings and disclosure. For the same reason, identical components may be given the same reference numerals, regardless of whether they are shown in different embodiments of the invention.

As used herein, "substrate" or substrate assembly may be meant to include, e.g., a portion of a semiconductor wafer. Such portion may have one or more layers of material including, but not limited to Si, Ge, SiGe, and all other semiconductors that have been formed on or within the substrate. Layered semiconductors comprising the same or different semiconducting material such as Si/Si, Si/SiGe and silicon-on-insulator (SOI) may also be included herein. These layers and/or additional layers may be patterned and/or may comprise dopants to produce devices (e.g., transistors, diodes, capacitors, interconnects, etc.) for an integration of circuitry. In forming these devices, one or more of the layers may comprise topographies of various heights. When referencing this integration of circuitry, therefore, it may be described as integrated together, on or with the substrate.

Furthermore, those skilled in the art will recognize that although embodiments of the present invention may describe fabrication of an N-type MOS transistor, the dopant type(s) of the substrate in addition to the doped regions thereof may be reversed to form a P-type MOS device. In addition, and in accordance with further embodiments, both N-type and P-type devices may be formed on the same substrate as part of a combined CMOS process.

Likewise, a thyristor may be described with a particular order of anode-emitter, N-base, P-base and cathode-emitter with the anode-emitter attached, e.g., to a reference voltage and perhaps the cathode-emitter in common with a source/drain region of an access transistor. It will be understood that other embodiments may comprise an alternative order of the thyristor or change of NMOSFET devices to PMOSFET. For such alternative polarity embodiments, the cathode-emitter might be coupled in a reference voltage and the anode-emitter coupled to an access transistor.

As referenced herein, portions of (e.g., a transistor or thyristor) may be described as formed in, at or on a semiconductor substrate. Such alternative terms in/at/on may be used individually merely for purposes of convenience. In the context of forming semiconductor devices, such terms may collectively reference portions of a semiconductor element that may be within and/or on a starting material.

In accordance with an embodiment of the present invention, with reference to FIGS. 1 through 4, a method of processing a semiconductor device may comprise forming first and second active regions 22,24 in semiconductor substrate 10. An isolation trench 12 may be formed to define a boundary between the first and second active region(s). In a particular embodiment, the semiconductor substrate 10 may initially comprise a P-type semiconductor material 21 and the first active region 22 may be defined by implanting N-type dopant for well 20 within the semiconductor material of substrate 10. The patterning and definition of the "N" well for the first active region 22 may be performed using standard photolithographic patterning techniques.

Next, further referencing FIG. 1, a dielectric such as an oxide may be formed over substrate 10 and may be described as a gate oxide for different gate stacks that may be formed thereover. After forming dielectric 16A,16B, poly may then be deposited, doped and patterned in to define gate electrodes 14A, 14B in insulated relationship over respective active regions 22,24.

Next, further referencing FIG. 1, one of the first or second active region(s) 22,24 may be masked with photoresist while processing the other active region for defining devices therein. For example, active region 22 may be masked while pattering N-type, extension regions 30,32 about gate electrode 14B. Additionally, halo implants might also be provided around gate electrode 14B between the extension regions 30,32 and the respective channel region. In a particular embodiment, these halo implants may comprise, e.g., boron implanted with an implant angle of about 35 degrees, energy of 65 keV, and dosage of $2\times10^{13}$ per centimeter squared.

In one example, the gate oxide may be formed with a thickness of 10 nanometers, the polysilicon for the gate with a thickness of 200 nanometers and the implant for the extension regions may be formed using phosphorous of an implant dosage of $8\times10^{14}$ per cm$^2$.

Although, particular levels and thicknesses may be disclosed for a particular embodiment to forming N-channel devices over active region 24, it will be understood that these parameters are merely exemplary and that alternative geometry's for oxide thickness, implant species or densities may be used for defining devices of alternative specifications. For example, in another example, the oxide thickness for the gate stack might comprise a thermal oxide of 2 nanometers and the N-type extension species of arsenic that may be implanted with a 7 degree angle and an energy level of 5 keV with a dosage of $8\times10^{14}$ per centimeter squared. In some cases, the extension regions may be references as lightly doped drain (LDD) regions; however, it may be noted that the dopant concentration of the extension regions may be very close to that of the source/drain regions.

After defining the N-type, extension regions of the second active region 24, it may then be masked while forming P-type extension regions in the first active region 22. The P-type extensions may be formed using, e.g., boron with an implant angle of less than 7 degrees, implant energy of 4 keV and dosage of $4\times10^{14}$ per centimeter squared. Additionally, halo implants may be formed using an arsenic dopant of an implant angle of about 45 degrees, energy of 120 keV and dosage of $2\times10^{13}$ per centimeter squared.

After defining the extension regions (and/or Halos) for the N/P-type MOSFET devices over the respective active regions 24,22, the process flow may continue with definition of the P+ and N+ source/drain regions, typically of greater depth and, in some embodiment, of greater dopant concentrations. Referencing FIG. 2, dielectric 34 may be layered conformally over substrate 10 and gate electrodes 14A,14B. In a particular embodiment, dielectric 34 may comprise a material appropriate for blocking diffusion of metal atoms, as might otherwise occur during formation of silicide into an upper region of a silicon layer of the semiconductor substrate. Likewise, dielectric 34 might also be used to block epitaxial deposition in further embodiments of the present invention.

Figure 2:
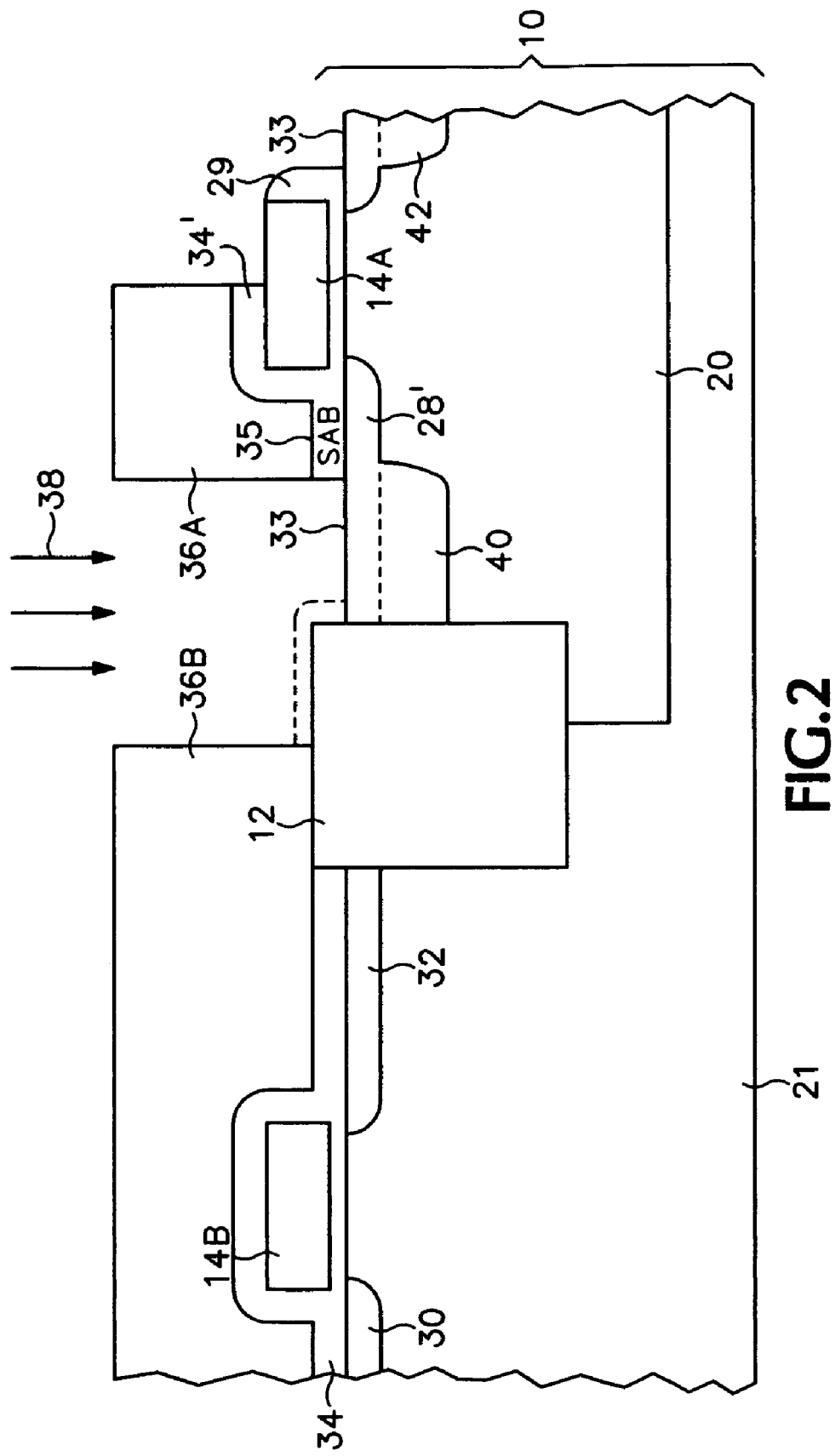
FIG. 2 is a cross-sectional view of a portion of the semiconductor substrate of FIG. 1 in another stage of processing, useful to further describe a method of fabricating the semiconductor device and showing deep level source/drain implants about a gate electrode.

Continuing with this particular embodiment with further reference to FIG. 2, photoresist 36 may be layered over substrate 10, electrodes 14A,14B, and the conformal layer of dielectric 34. Photoresist 36 may then be patterned to facilitate patterning of the dielectric to define mask 34' and to expose regions 33 of semiconductor substrate 10.

In accordance with a particular embodiment, it may be understood that the dielectric material of layer 34 may be removed by an anisotropic etch and as defined by patterned photoresist mask 36A. Alternatively, the exposed region of the dielectric material 34 may be removed by an anisotropic etch.

Using the patterned dielectric 34' and photoresist 36A, 36B as an implant mask, P-type dopant 38 may be implanted into regions 40,42 of semiconductor substrate 10 for defining the greater density and depth P+ regions for the source/drain regions of a P-MOSFET device. In this particular embodiment, the dielectric patterned mask 34' may comprise a shoulder 35 that extends laterally outward from gate electrode 14A that may also be used to define a length of the extension region 28' via the self-alignment of the higher energy P-type dopant 38.

Figure 3:
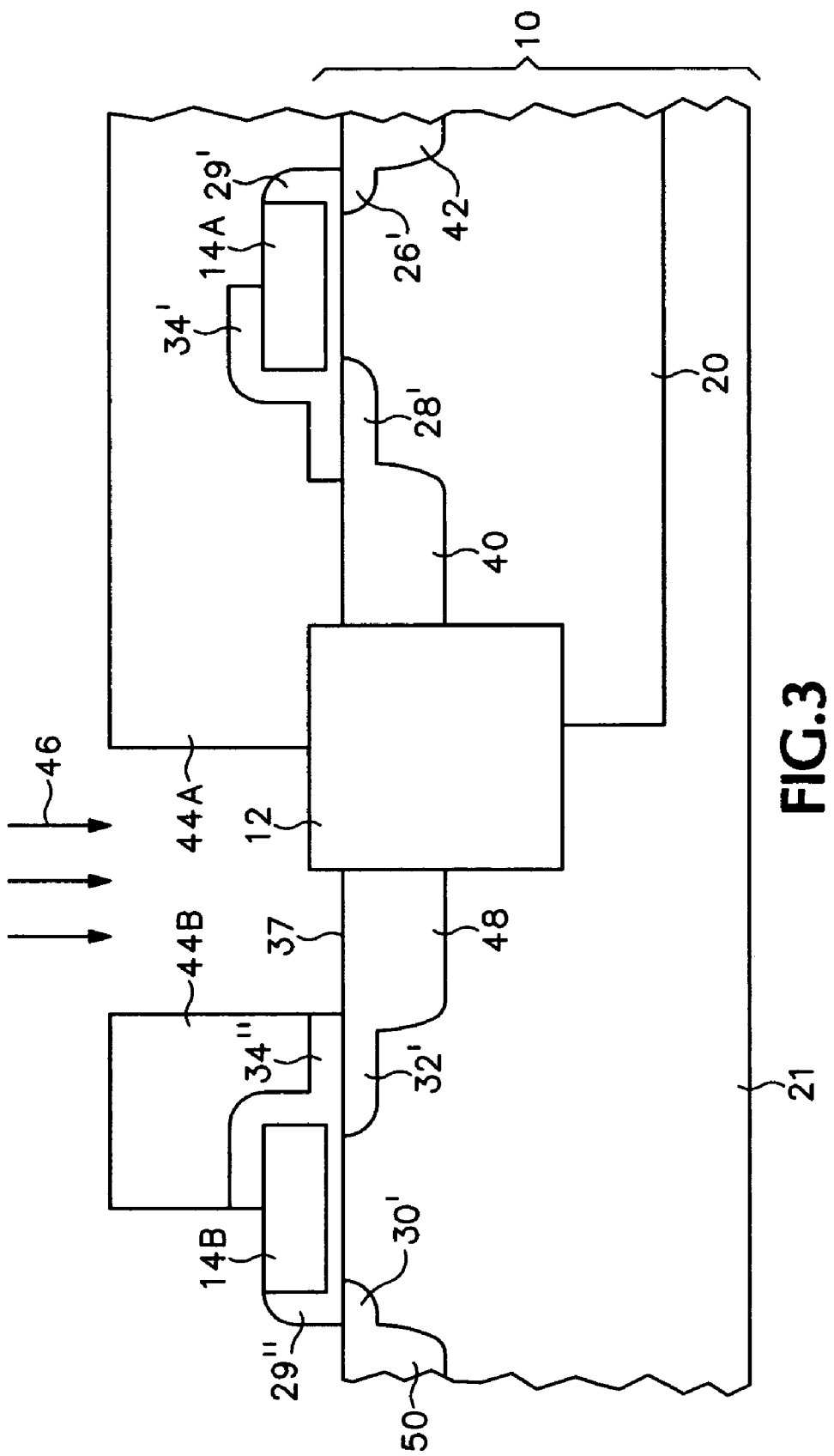
FIG. 3 is a cross sectional view of a portion of the semiconductor substrate of FIGS. 1 through 2, in another stage of processing and useful to further describe the method of forming the semiconductor device in an embodiment of the present invention, and showing implants about a gate electrode associated with another active region.

After defining the P+ regions for the P-channel MOSFETS over active region 22, the process flow may continue with definition with mask patterning 44A,44B for similar but opposite polarity-type processing over the other active area 24 of the substrate shown in FIG. 3. Again, exposed regions of dielectric 34 may be removed by one of either an anisotropic or isotropic etch to define mask 34" and to expose regions 37 of the semiconductor material. N-type dopant material may then be implanted for defining the deep level N+ regions 48,50 of respective source/drain regions of the N-MOSFETS. In a particular embodiment, the deep implants for the N+ regions 48,50 may be formed using implant species such as arsenic with an implant dose of $2\times10^{15}$ and energy of about 40 keV.

Further referencing FIG. 3, dielectric material 34 may be patterned in accordance with photoresist mask 44B to define mask 34" with a shoulder that extends laterally outward from gate electrode 144B. The lateral extent of this shoulder may define an extent of the extension region between gate electrode 14B and the interface to the deep level N+ implant 48.

Figure 4:
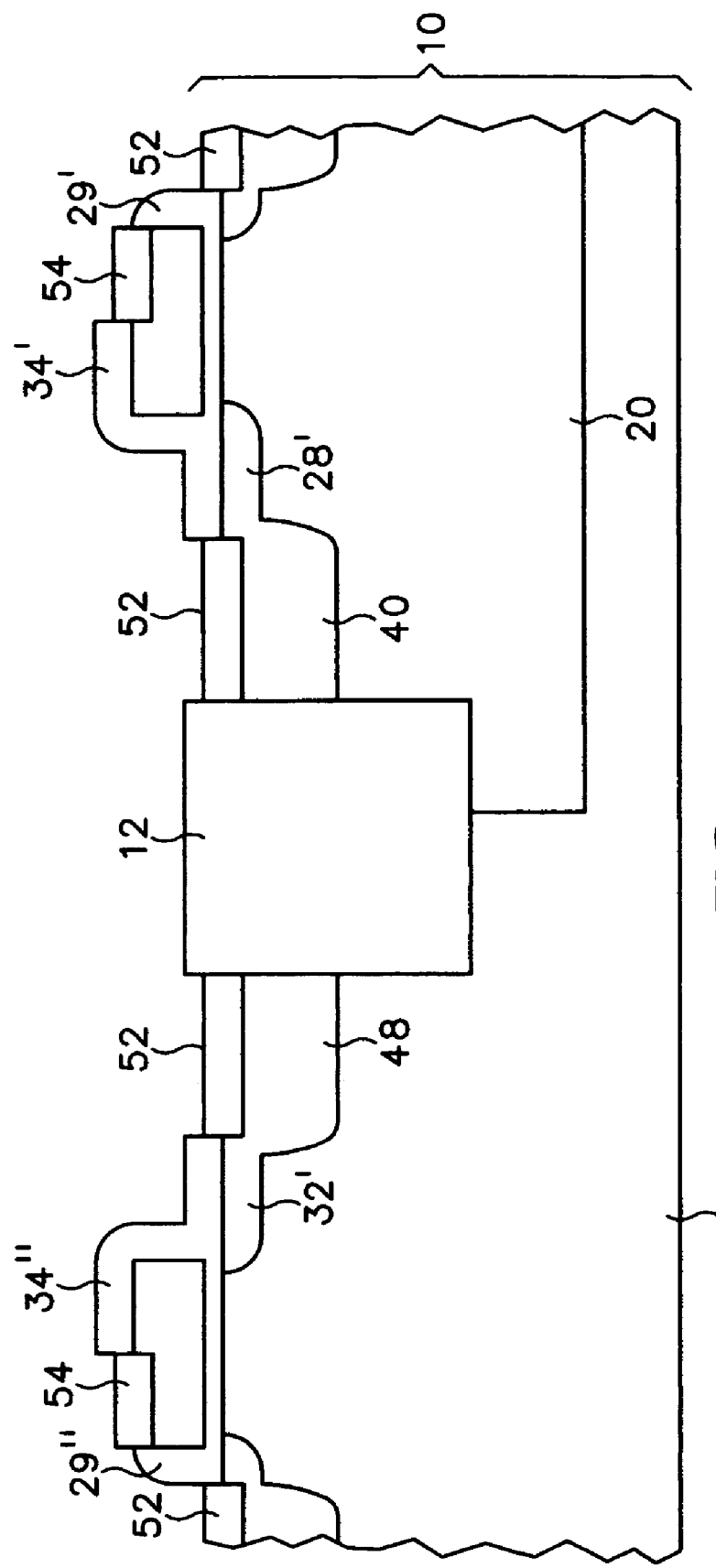
FIG. 4 is a cross sectional view of the portion of the semiconductor device of FIGS. 1 through 3, in another stage of processing and useful to further describe the method of forming a semiconductor device in accordance with an embodiment of the present invention, and showing the silicide in exposed regions of silicon as defined by a silicide blocking mask.

Moving forward with reference to FIG. 4, after defining the N+ and P+ deep level implants for the respective N and P channel MOSFET devices, photoresist 44 may be removed. While using the dielectric patterns 34' and 34" with shoulders that extend laterally outward from their gate electrodes and over the respective lengths of the extension regions 28' and 32', metal such as at least one of tungsten, nickel, cobalt, platinum, titanium or other refractory metal may be deposited over the masked substrate. A heat treatment may then diffuse metal into the exposed regions of semiconductor material 10 and also any exposed regions of the polysilicon gate electrodes. The exposed regions may be defined by the masks 34' and 34" and spacers 29',29". After diffusing the metal into the exposed regions of semiconductor material, an acid bath may be used to strip unreacted portions of the metal to leave silicide 52,54 on the deep level implant regions of MOSFET devices and on the gate electrodes respectively. The outline of the deep level implants may be aligned at least in part relative to the patterning of silicide structures 52. This may be alternatively disclosed as defining a boundary of the deep level implants and respective source/drain extensions in alignment with the outlines of the silicide thereover.

After siliciding the exposed regions of semiconductor material, processing of the semiconductor device may be performed in typical fashion for interconnecting the different transistors with other elements of the semiconductor substrate. Through such processing, insulating materials may be formed over the structures and appropriate conductive interconnects patterned to respective contacts of the various gate and/or source/drain regions to form part of an integrated circuit.

Figure 5:
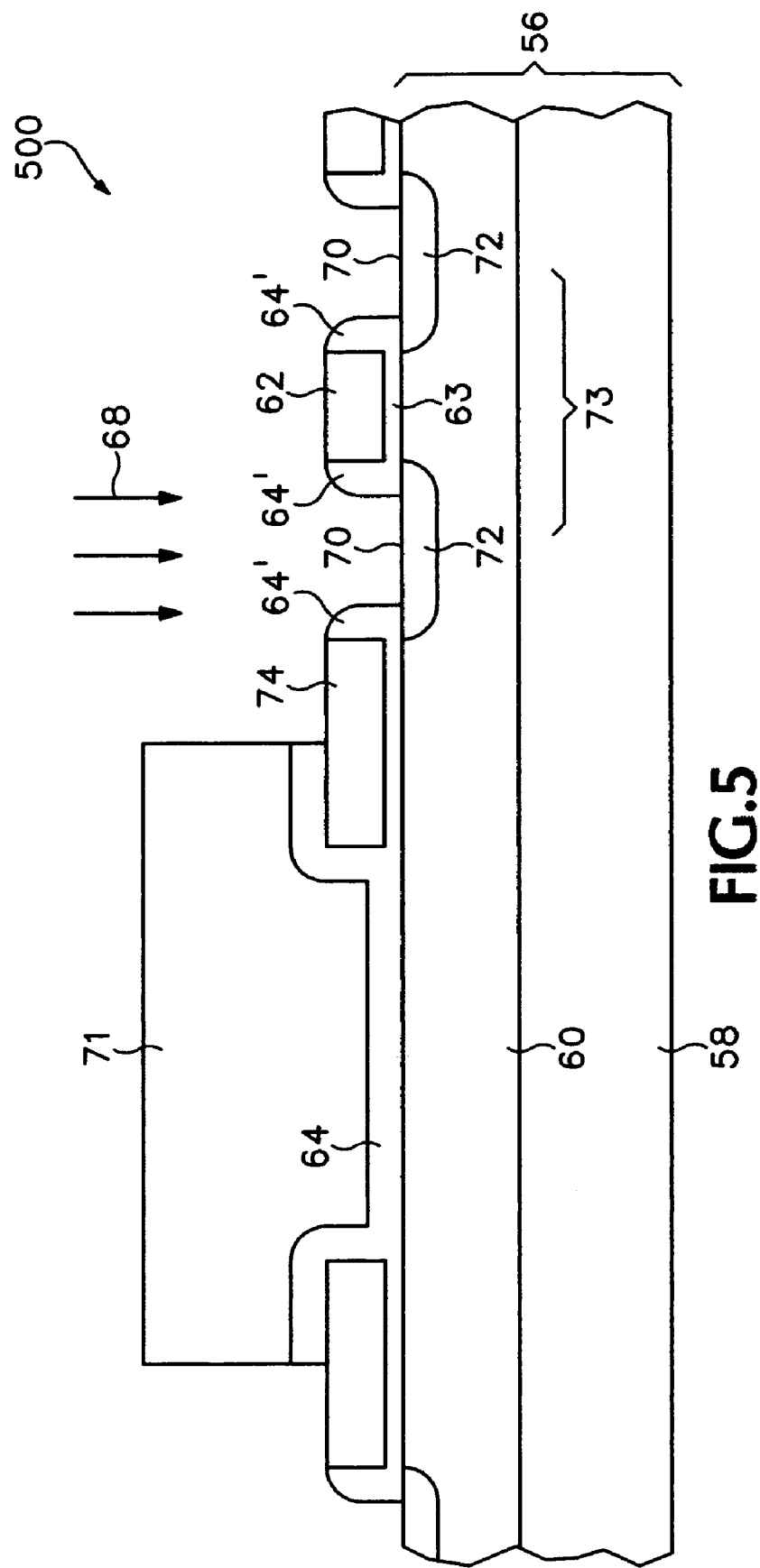
FIG. 5 is a cross sectional view of a portion of a semiconductor device and useful to further describe an alternative method of processing of the present invention, and showing extension regions about a gate electrode of an access transistor to a thyristor memory.
Figure 6:
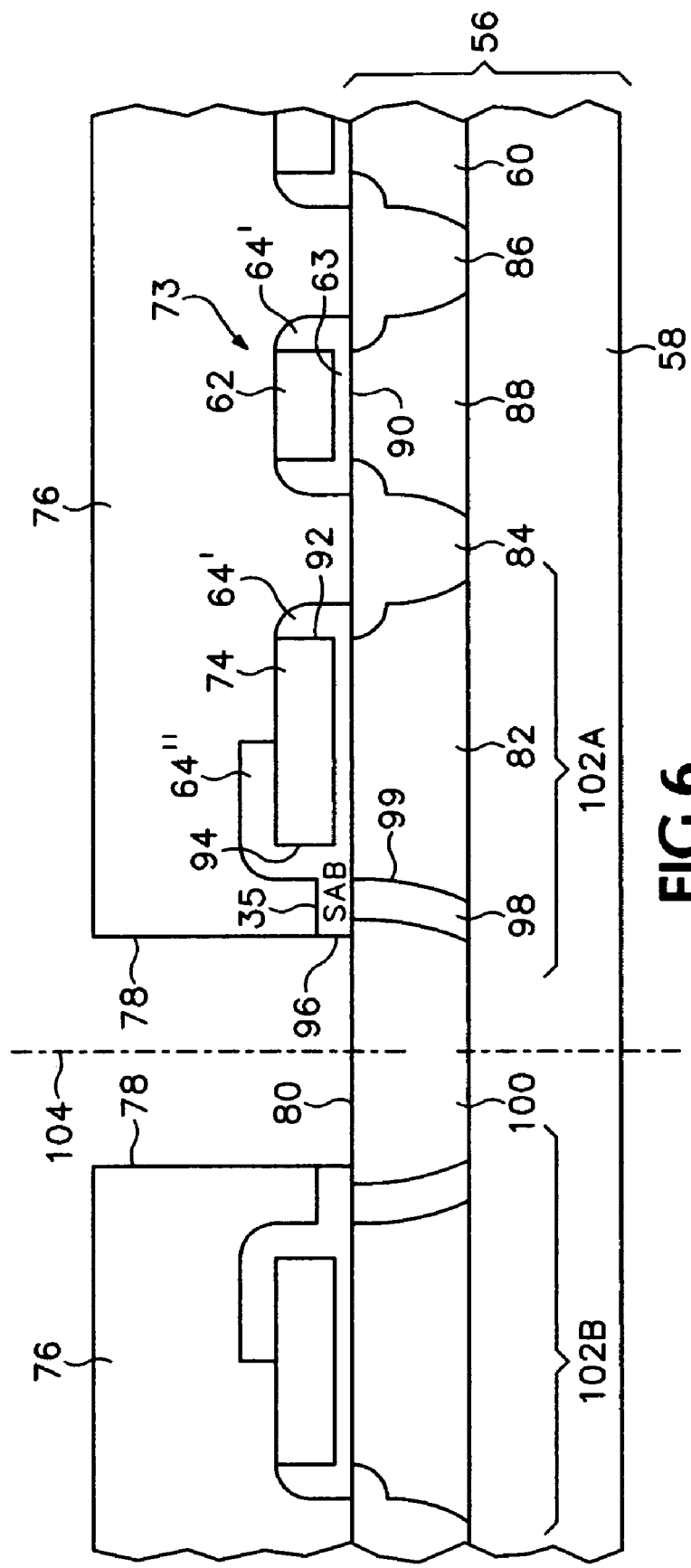
FIG. 6 is a cross sectional view of a portion of a semiconductor device of FIG. 5, in another stage of processing a thin capacitively coupled thyristor and showing implants for at least one of the N-base and one of the anode/cathode-emitters.

In accordance with another embodiment of the present invention, with reference to FIGS. 5 and 6, a method of forming a thin capacitively coupled thyristor may employ use of a silicide-blocking mask for definition of multiple features of the thyristor device. As shown in FIG. 5, a layer of semiconductor material 60, such as silicon, may be formed over an insulating layer 58 such as an oxide to provide a substrate 56. The substrate might further comprise additional supporting structures (not shown). In a particular embodiment, the layer of semiconductor material 60 may comprise silicon of a depth of less than 100 nanometers, and more typically, less than 50 nanometers. Such substrate structure 56 can be described as a silicon-on-insulator (SOI) substrate.

As described earlier relative to FIG. 1, dielectric 63 such as an oxide may be formed over semiconductor material 60 to define, for example, a gate oxide. After forming the gate oxide, poly may be deposited and patterned to form electrodes 62 and 74 over the gate oxide 63. Electrode 62 may be formed above regions for a MOSFET by which to access the thyristor. Electrode 74 may be formed over a base region of a thyristor to be capacitively coupled thereto. As referenced subsequently herein, gate electrode 62 and capacitor electrode 74 may be described alternatively as wordline one and wordline two or first and second wordlines respectively.

With further reference to FIG. 5, after patterning the first and second wordlines 62 and 74, dielectric may be formed conformally over substrate 52 and the electrodes 62,74. Next, photoresist may be layered over dielectric 64 and patterned to define photoresist mask 71 thereover. In this particular embodiment, photoresist mask 71 may define exposed regions of dielectric over a portion of second wordline 74, all of first wordline 62 and regions of the semiconductor material about first wordline 62.

After patterning photoresist mask 71, the exposed regions of the dielectric may be etched by an anisotropic etch. The anisotropic etch may be selective for etching the dielectric more favorably relative to semiconductor material 60. The anisotropic etch may be stopped after exposing poly of wordlines 62,74 and silicon of the semiconductor material 60 between the first and second wordlines. By such anisotropic etch, dielectric spacers 64' may be defined about sidewalls of first wordline 62 and against a sidewall of second wordline 74 proximate the first wordline. It may be noted that the width (or thickness) of the sidewall spacers 64' may comprise a magnitude comparable to the original thickness of the dielectric layer 64.

After forming the first and second wordlines 62,74 and typically before layering the dielectric material 74, the extensions 72 may be formed about wordline 62, similarly as described earlier herein relative to FIG. 1. For example, they may be formed with a dopant of arsenic using an implant angle of approximately 0 degrees, dosage of $8 \times 10^{14}$ and energy of about 5 keV. Additionally, photoresist masking may be used to block regions of semiconductor material 60 on a side of the second word/line 74 opposite to that of the first wordline 62 during the formation of extensions 72.

In addition, halo implants may be provided, as known in the art, proximate the extension regions 72 and near the channel regions beneath the first word/line 62. After forming the extensions and/or the halo regions for the access transistor 73, dielectric layer 64 might then be deposited as a conformal layer as referenced earlier herein to cover the substrate by which to form the sidewall spacers 64'.

After sidewall spacers 64' have been formed against sidewalls of first wordline 62 and the sidewall of second wordline 74 proximate the first wordline, N-type dopant 68 may be implanted using species, energy and dosages for definition of the deeper and higher density source/drain regions 84 and 86 (referencing FIG. 6) about the first wordline 62. It may be seen that these deep level implants 84,86 may penetrate the full depth of semiconductor material 60 associated with SOI substrate 56. Additionally, deep level implants 84,86 in combination with the shallow level implants 72 (FIG. 5) proximate the channel 90 beneath gate electrode 62 and may define, at least in part, N-MOSFET device 73. In operation, by applying a bias to gate electrode 62, a conductive channel 90 may be defined between the source drain regions of the N-channel MOSFET to allow access to the thyristor. Subsequently herein, the N-channel MOSFET device may be described alternatively as access transistor 73.

Moving forward with further reference to FIG. 6, another photoresist mask 76 may be formed over the substrate and may comprise a portion thereof over a shoulder 35 of the dielectric layer extending laterally outward from the second wordline 74 and on a side thereof opposite to first wordline 62. The lateral extent for shoulder 35 may comprise a distance that is greater than the conformal thickness of the dielectric material, and sufficient for forming an N-base region therebelow and laterally offset from a peripheral edge 94 of the second electrode 74. After defining sidewalls 78 of photoresist 76 to expose regions of the dielectric, an etch, such as an anisotropic etch, may be used to remove the exposed portions of dielectric and to expose portions 80 of the semiconductor material 60. The anisotropic etch, in turn, may define dielectric mask 64" over a portion of second wordline 74, extending along a sidewall 94 of the wordline opposite to the first wordline and extending laterally outward therefrom over a portion of semiconductor material 60.

In accordance with one embodiment of the present invention, photoresist 76 in combination with patterned dielectric mask 64' may be used together as an implant mask for definition of N-base 98 and also for definition of anode-emitter region 100. As used herein, it will be understood that the anode-emitter of the thyristor could be formed with opposite dopant to provide the cathode-emitter. Likewise, the cathode-emitter of the thyristor could be formed with opposite conductivity type to provide the anode-emitter.

Further referencing FIG. 6, in the present embodiment, N-base 98 may be formed using an implant species such as phosphorous with an implant angle of about 45 degrees, an implant dose of $5\times10^{14}$ per $cm^2$ and energy of about 70 keV. It will be understood; that the implant species, angle and energy in combination with the lateral extent of the implant mask 64" may be controlled to implant the impurity species for establishing an extent therefore beneath shoulder 35 of dielectric 64" and, at the same time, offset from edge 94 of second wordline 74. Being offset from the second wordline, N-base 98 may be able to avoid gate induced leakage affects with respect to second wordline 74. After implanting N-base 98, the same mask 64" may be used during implant of P-type impurities to define anode-emitter region 100, to complete primary portions of thyristor 102A. During implant of the P-type dopant, an implant species such as boron may be used with an implant angle of less than about 4 degrees at a dosage of about $5\times10^{15}$ per centimeter square and implant energy of about 10 keV.

Further referencing FIG. 6, it may be understood that mirrored elements of thyristor 102 and access transistor 73 may be formed in the substrate about mirror access 104.

After defining N-base 98 and anode-emitter 100, photoresist 76 may be removed. Moving forward with reference to FIG. 7, metal comprising at least one of the group consisting of cobalt, titanium, tungsten, platinum, nickel, or other refractory metal may be formed over the substrate including wordlines 74,62 and mask elements 64',64". A heat process may then be performed using a temperature sufficient to cause the metal to react with the silicon but low enough that no metal/dielectric (64) reaction occurs. Metal may diffuse into the surface of the exposed portions of substrate 60 and also into the surface of the exposed portions of polysilicon of gate electrodes 62,74. After such silicide formation, remaining metal may be removed using, e.g., an acid bath, leaving salicide over anode-emitter 100 that is self-aligned relative to mask 64". Silicide may also be formed over a portion of the second wordline between dielectric mask 64" and its sidewall spacer 64'. Additionally, silicide 114 may be formed over the cathode-emitter region 84 between spacers 64' of the adjacent electrodes 62,74 and silicide 116,118 also on top of the first wordline 62 and also over source/drain region 86 of the access transistor 73. After siliciding the exposed silicon regions, subsequent processing may be formed as known to provide electrical contacts to the anode-emitter, wordlines and bitline contacts for enabling electrical interfacing and operation of the thyristor memory cell 700.

In accordance with an alternative embodiment of the present invention, the definition of N-base 98 and anode-emitter 100 may be performed prior to performing the deep level source/drain implants about access transistor 73. For example, after defining a peripheral edge 96 of the dielectric material layer 64, and after implanting N-base 98 and anode-emitter 100, photoresist may be formed over these regions while leaving other areas exposed to allow formation of spacer 64' adjacent the wordlines. Implant of the deep level drain/source regions 84,86 of the access transistor 73 might then be performed. In other words, deep level implants 84,86 for the access transistor may be established either before or after formation of the N-base 98 and anode-emitter 100 for the thyristor device 102A. Again, it may be seen that the extent 99 of N-base 98 beneath the shoulder 35 of the dielectric mask 64" may be defined at least in part by an outline associated with patterning of silicide 110. Additionally, it may be seen that extent 99 is offset laterally from the peripheral edge 94 of second wordline 74. Subsequently herein, extent 99 may be referenced alternatively as interface 99.

In a further embodiment, an additional lifetime adjustment implant may be performed across the interface 101 between the anode-emitter 100 and N-base 98 such that the impurity lifetime adjustment species effect leakage properties of the interface 101 therebetween, but not interface 99 between N-base 98 and P-base 82. In accordance with such embodiment, the implant species, energy level and angle of incidence may be selected such that the lifetime adjustment species overlaps the interface 101 between anode-emitter 100 and N-base 98, but not across the interface 99 between the N-base and P-base. Examples of such lifetime adjustment species may include impurities such as germanium, metal, or inert gas, of a damage type implant. Further information regarding lifetime adjustment species may be found in may be found in U.S. Pat. No. 6,462,359 entitled "Stability In Thyristor-Based Memory Device" of Nemati et al., hereby incorporated by reference in its entirety.

Figure 7:
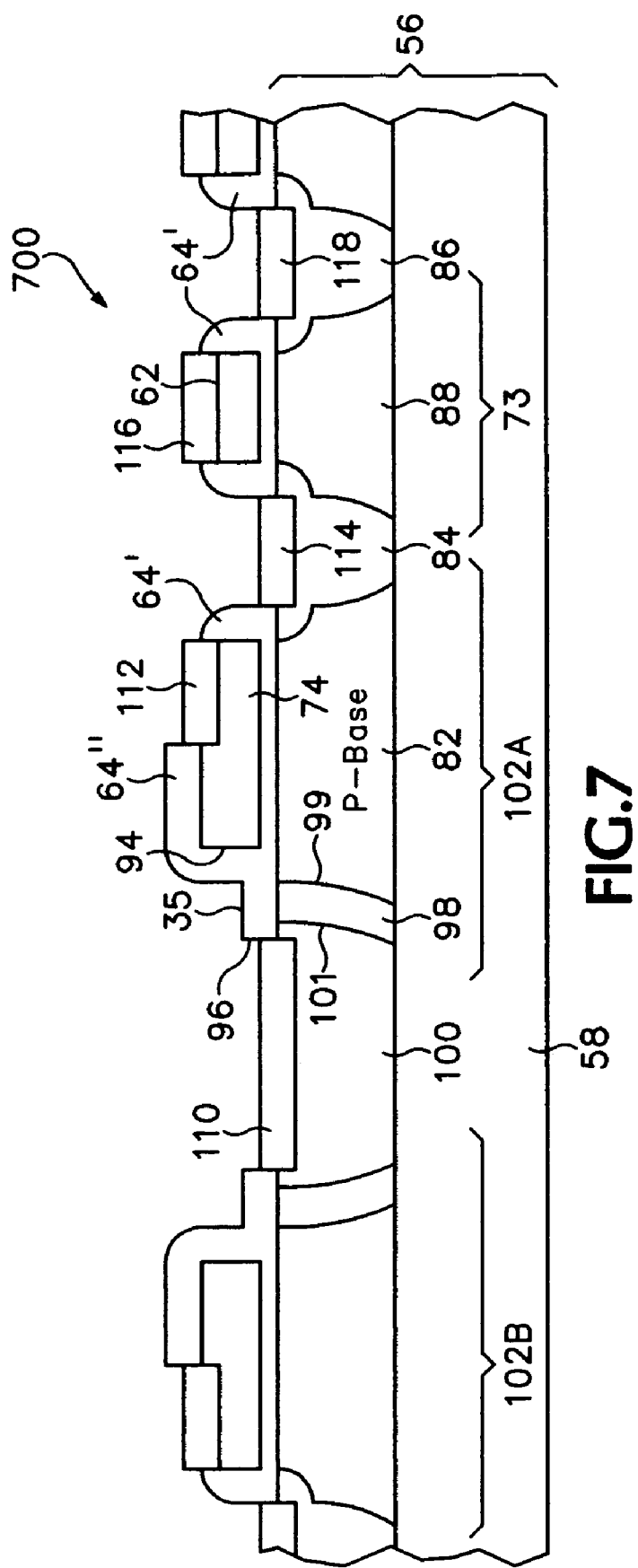
FIG. 7 is a cross sectional view of a portion of a semiconductor substrate of FIGS. 6 and 7 in another stage of processing useful to further describe a method of forming a thyristor memory, and showing salicide formed over exposed silicon regions.
Figure 8C:
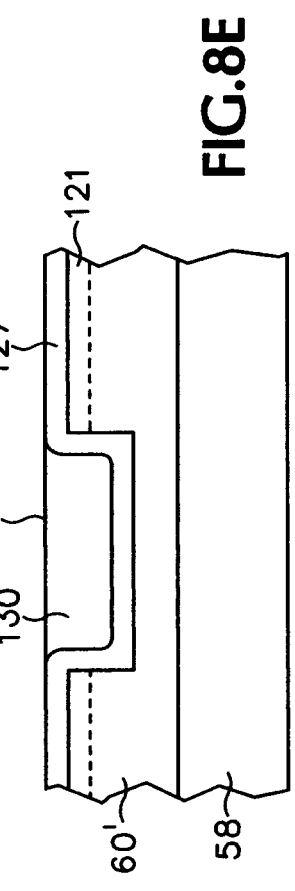
FIGS. 8A through 8E are cross-sectional views of a portion of a semiconductor substrate during a method of forming trench regions within an SOI semiconductor device, which may be used in a method of forming a semiconductor device of the present invention.
Figure 8D:
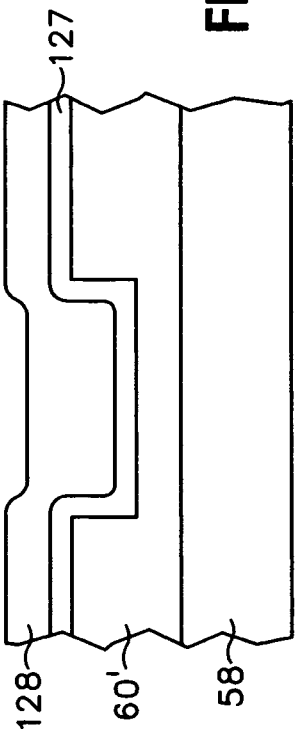
Figure 8E:
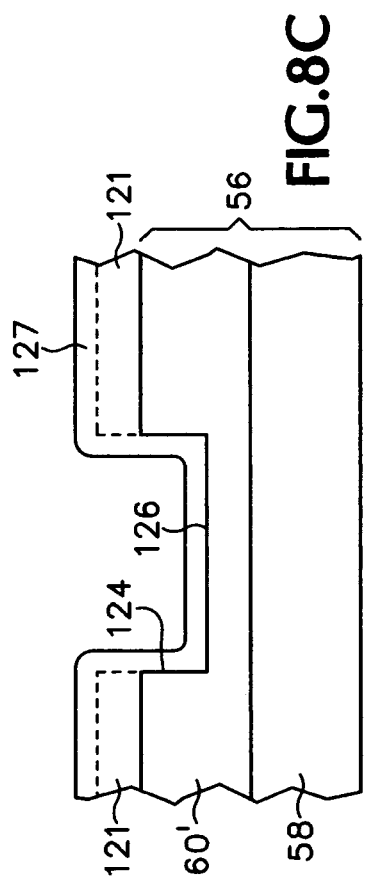
Figure 8A:
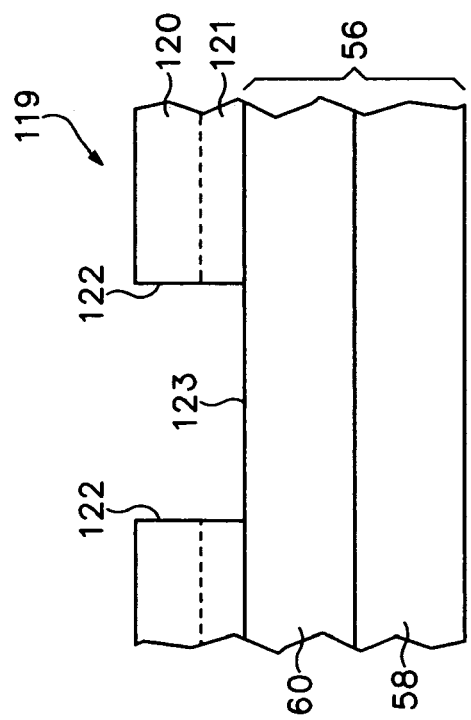
Figure 8B:
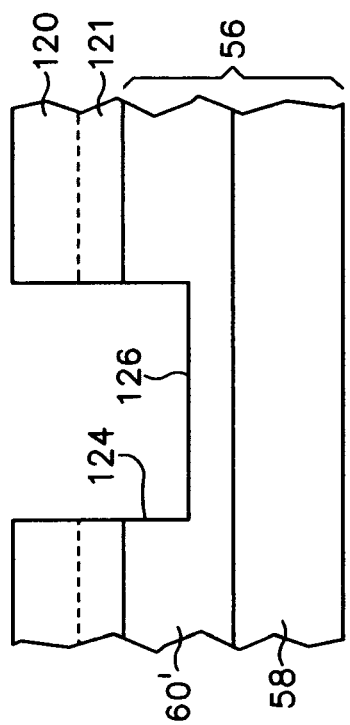
Figure 9:
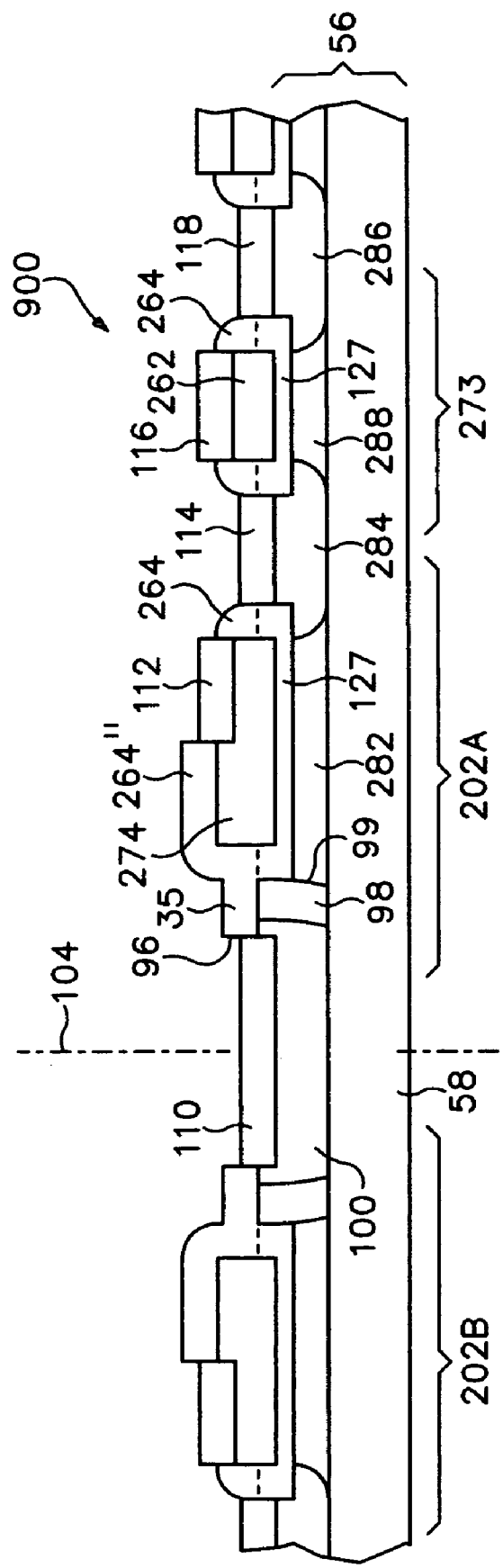
FIG. 9 is a cross sectional view of a portion of a semiconductor substrate illustrating a thyristor memory comprising gate electrodes recessed within trenches of an SOI substrate.

In accordance with a further embodiment of the present invention, skipping forward with reference to FIG. 9, an alternative thyristor and access transistor configuration of a thyristor memory device 900 may comprise capacitor electrode 274 and gate electrode 262 recessed in trenches, which may be used to reduce the thickness of the silicon regions 282 and 288 beneath the electrodes. This alternative structure 900 can be contrasted with the configuration of thyristor memory device 700 as shown in FIG. 7. In this particular embodiment, the SOI substrate 56 may comprise silicon of about a 100-nanometer thickness over buried oxide 58. The trench formations, in which to form electrodes 262,274, may reduce the silicon thickness at their floors to a thickness of about 30 nanometers. Other than the trench structures, formation of the thyristor memory cell 900 may essentially follow the processing procedures as may be outlined herein relative to other thyristor memory devices such as device 700 of FIG. 7. Regarding the trench structures, they may be formed by a process as described below with reference to FIGS. 8A through 8E.

Referencing FIGS. 8A through 8E, in accordance with an embodiment of forming trenches, which may be used to recess electrodes of a thyristor memory device (900 of FIG. 9), a SOI substrate 56 may initially be coated with photoresist and then photolithographically processed to define a patterned photoresist 120 with sidewalls 122. The sidewalls may define a window to expose a region 123 of semiconductor material 60. In a particular embodiment, semiconductor material of layer 60 comprises silicon. In an optional embodiment, an additional insulating layer 121 such as oxide or nitride might also be disposed over silicon layer 60. The depth of insulating material 121 may assist formation of the electrodes to establish with a height therefore that will be above the surface of the silicon layer 60.

Moving forward with reference to FIG. 8B, an exposed portion 123 of silicon layer 60 may be etched using, for example, an anisotropic etch to remove the exposed silicon as defined by the opening in the patterned photoresist 120. In the optional aspect, the etch might first remove exposed regions of the insulating material 121 and, secondly and perhaps in a continuous in-situ etch process with the first, then remove the exposed regions of the silicon layer 60. In a particular example, where the semiconductor material 60 of the SOI substrate 56 may comprises a thickness of 50 nanometers, for example, the etch may remove approximately 20 nanometers of silicon to define floor 126 of the trench with 30 nanometers of silicon therebelow to the buried oxide 58. Again, it will be understood that such dimensions for the trench and thickness of the silicon material may be representative of merely one exemplary embodiment and that alternative embodiments may use different dimensions for the silicon and trench.

Moving forward with reference to FIGS. 8C and 8D, after forming the trench, a dielectric may be conformally layered over the semiconductor material 60 and conformal to its sidewalls 124 and floor 126. In a particular embodiment, the conformal layer of dielectric 127 may comprise an oxide and may be grown by a thermal gate-ox process. It will be understood, that during such oxide formation a portion of the silicon may be consumed by the thermal oxidation so as to reduce its thickness between the floor of the trench 126 and the surface of the buried oxide 58. After lining the trench with the dielectric 127, poly-silicon 128 may be deposited with a thickness sufficient for filling and exceeding the depth of the trench as shown in FIG. 8D.

Referencing FIG. 8E, a planarization procedure such as a chemical mechanical polishing process may be used to planerize and remove some of the polysilicon until exposing insulating material 127. In accordance with the optional embodiment, the planerization continues until reaching an upper surface of insulating layer 121. This may define gate electrode 130 within the trench with an upper surface 132 the same level as that of dielectric 127. Next, an etch may remove exposed portions of the insulating material 127 and/or also the exposed portions of insulating material 121. Accordingly, electrode 130 may be formed with a height above the surface level of semiconductor material 60'.

Again, referencing FIG. 9, it may be understood that the first and second wordlines 262,274 may be formed as recess electrodes in trenches as just described with reference to FIGS. 8A through 8E. Fabrication of the thyristor memory device 900 might then follow processes as described otherwise herein such as for the embodiments for the thyristor memory device 700 of FIG. 7. For example, after the electrodes have been formed within the recessed trenches of the SOI substrate 56, dielectric material may be layered conformally thereover and then anisotropically etched to form spacers 264. And, as before, photoresist may be patterned over other regions of the dielectric material in order to define mask 264" with a shoulder 35 having a peripheral edge 96 offset from second wordline 274. Definition of the source and drain regions 284,286 about access transistor 273 might then be performed after definition of spacers 264, or alternatively, after definition of N-base 98 and anode/cathode-emitter region 100. Following the implants for the definition of N-base 98, anode/cathode-emitter 100, cathode/anode-emitter 284 and the opposite source/drain region 286; the silicide processing can define salicide regions 110,112,114,116,118 self-aligned to and in exposed surface regions of silicon as defined by the silicide blocking materials 264",264.

For capacitively coupled thyristor memory cell 900, it may be noted that with the first and second wordlines 262,274 in trenches that the anode-emitter, cathode-emitter and source/drain regions may be described as being raised when viewed relative to the channel regions beneath the electrodes. In accordance with alternative embodiments of the present invention, these raised silicon regions might be formed using alternative epitaxial processes, as will be described more fully below.

Figure 10:
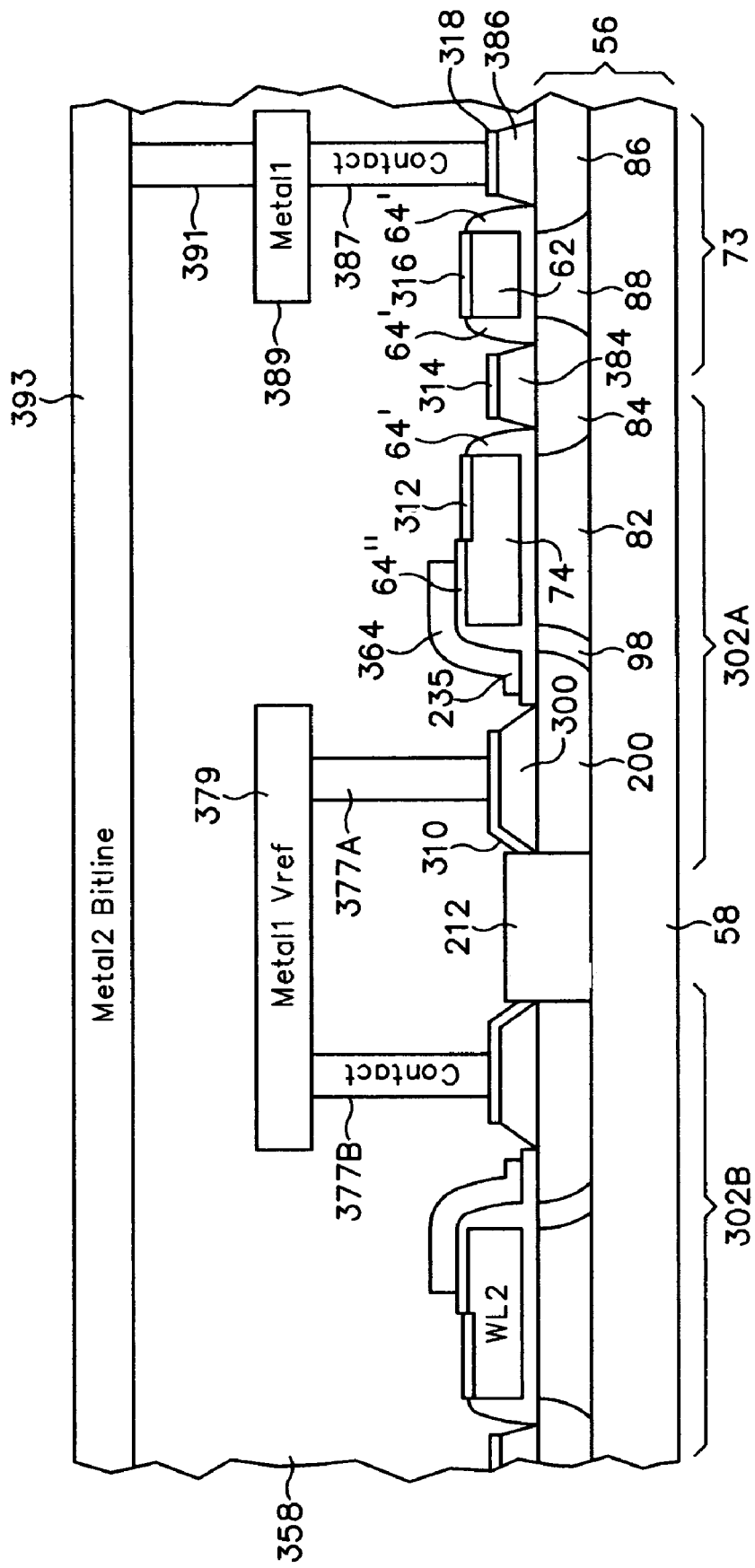
FIG. 10 is a cross sectional view of a portion of a semiconductor device illustrating a thyristor memory of another embodiment of the present invention and showing raised source/drain regions and silicide in alignment with a silicide-blocking material.

In accordance with yet another alternative embodiment of the present invention, as shown in FIG. 10 and in comparison to FIG. 7, additional blocking material may be layered over dielectric layer 64 in order to increase its thickness appropriately so that it may block ions during bombardment for formation of N-base 98. In this particular embodiment, sidewall spacers 64', may be formed while patterned photoresist covers a portion of the second wordline 74 and also over regions where N-base 98 and anode-emitter 200 may be formed. After defining spacers 64', the photoresist patterning may be reversed to cover the opposite portion of the second wordline 74, and to cover the source/drain regions about access transistor 73. After such photoresist re-definition, material for mask 364 may be deposited over the previously layered dielectric 64. Next, photo patterning and etching may be used to form the additional blocking material 364 over the lower dielectric layer 64". While using the increased thickness of blocking material 364 in combination with patterned dielectric 64" together as an implant mask, ion bombardment may be performed to define N-base 98 beneath the lateral shoulder 235. Next, the anode-emitter implant may be performed while also using the mask of elements 364 and 64". The second blocking material 364 might then be removed (or alternatively left in place) during epitaxial deposition on regions 200,84,86. Silicide processing might also define salicides 310,312,314,316,318 over respective raised anode-emitter 300, second wordline 74, raised source 384, first wordline 62, and raised drain 386 respectively. Known metal interconnects, e.g., might then be formed to couple a voltage reference to the thyristor anode-emitter 200 via interconnect 377 and to couple a bitline 393 to its bitline contacts 318 via conductive interconnects 391,389,387. Dielectric 358 is illustrated generally in FIG. 10 about the various metal layers. It is understood, however, that such material may comprise multiple layers of insulating materials as might be used during the formation of the different metal layers 379,393. Such insulating material 358 might include, for example, spin-on-glass, BPSG, TEOS, etc.

Figure 11:
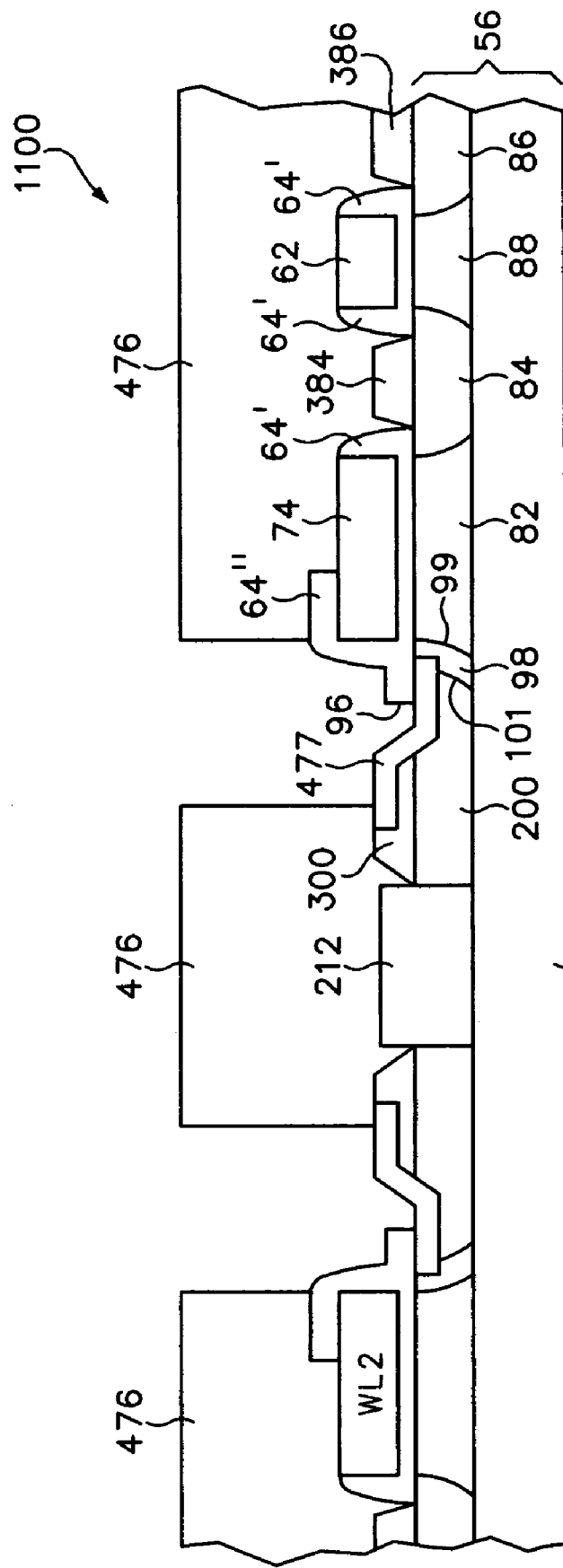
FIG. 11 is a cross sectional view showing a portion of a semiconductor substrate during another method of processing a thyristor memory, and showing leakage implants overlapping an interface between an anode-emitter and base region.

Moving forward with reference to FIG. 11, in accordance with a further embodiment of the present invention, lifetime adjustment impurity species may be implanted into select regions 477 of the thyristor memory cell 1100. The select region 477 may be defined in accordance with photoresist pattern 476 and self-aligned relative to peripheral edge 96 of the silicide blocking mask 64". Photoresist 476 may be formed over the first and second wordlines 62,74 and over the source and drain regions of the access transistor 73. Additionally, the photoresist 476 might also be formed over the trench isolation region 212 and portions of anode-emitter 200/300 proximate the isolation trench. The species, energy and angle of incidence during the implant may be selected such that the implant of the lifetime adjustment impurity species may penetrate the interface 101 between anode-emitter 200 and N-base 98, but not interface 99 between N-base 98 and P-base 82. Such lifetime adjustment species may include at least one impurity of the group consisting of germanium, carbon, metal and/or an inert gas of damaging implant that may effect the lifetime of carriers within and across interface 101 of N-base 98 to anode-emitter 200. As shown in this particular embodiment of FIG. 11, the implant impurity species may penetrate a surface region 477 of raised silicon 300 and the surface region portion of a part of N-base 98.

After forming the carrier lifetime adjustment region 477, photoresist 476 may be removed and silicide processing performed similarly as otherwise described herein.

In an alternative embodiment, the lifetime adjustment impurity implant may be performed prior to formation of epitaxial material 300. Accordingly, the implant would affect an upper surface region of anode-emitter 200 and across interface 101 and into a portion of N-base 98. Thereafter, epitaxial and silicide processes could be performed as masked and aligned relative to the epi/silicide blocking effects of dielectric elements 212,64" and 64'.

Figure 12:
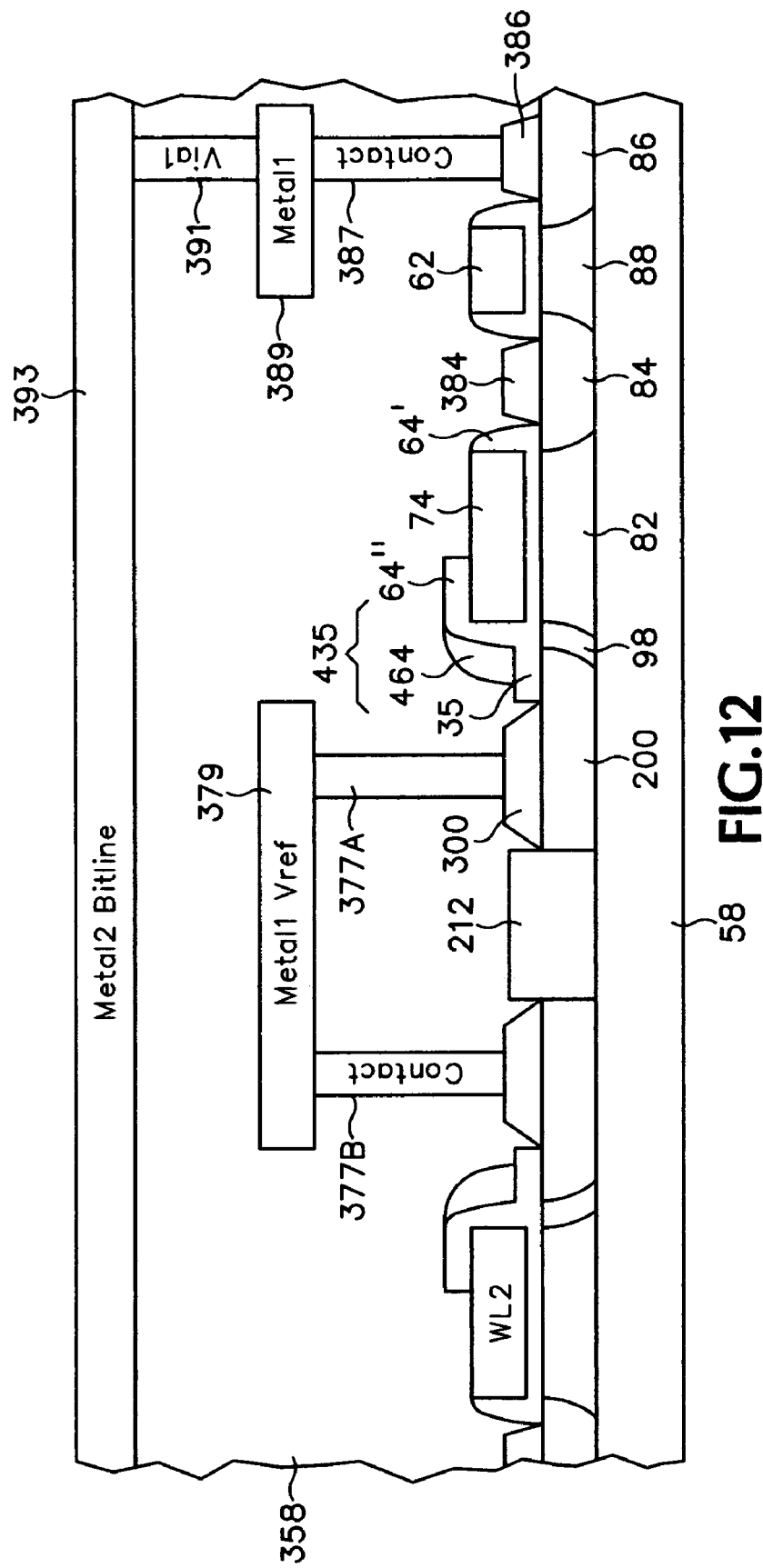
FIG. 12 is a cross sectional view showing a portion of a semiconductor substrate in a stage of processing useful to further describe a method of forming a thyristor memory of another embodiment, and showing a thickened spacer to assist implant of a base region.

In accordance with another embodiment of the present invention, with reference to FIG. 12, patterning of N-base 98 may be performed while using a thickened mask shoulder 435. The shoulder 35 of dielectric mask 64" may be thickened by forming a conformal layer of additional material thereover with a thickness greater than the width of shoulder 35. After forming the second material over the dielectric mask 64", the second material may be etched anisotropically to form another spacer 464 over shoulder 35 of dielectric mask 64". The dielectric mask 64" and added spacer 464 may be used in combination during an angled implant for the definition of N-base 98 therebelow. Processing might otherwise continue as described herein.

In accordance with a further embodiment of the present invention, referencing FIG. 13A, after forming first spacers 64', regions associated with access transistors of the semiconductor device may be protected by masking patterned photoresist 574 and a second layer of material layered and then etched anisotropically to define second spacer 564 to thicken the spacer width against a side of the second electrode 74 for a lateral offset appropriate for forming a N-base 98 therebelow (see FIG. 13B).

In an alternative embodiment, the second layer of material may be layered over all of the structures and then etched anisotropically to define spacers from the second layer of material alongside each of the sidewalls of the electrodes. Next, a resist layer may be formed/patterned to protect regions where the widened spacers should be kept. Unprotected spacers formed from the second layer of material may then be removed from around electrode 62 and between electrodes 62,74.

Further referencing FIGS. 13A and 13B, the angled implant for definition of N-base 98 may extend the impurities beneath second spacer 564 and also beneath portion of first spacer 64' to establish an interface 99 of the N-base therebelow. After forming the N-base, an implant of opposite conductivity may be performed to define anode-emitter 200. Next, epitaxial silicon may be selectively deposited over the exposed silicon regions to form raised structures 300,384,386 over respective anode-emitter 200, cathode-emitter 84 and source/drain 86. Following such epitaxial deposition, sacrificial spacer 564 may be removed and photoresist patterned to define mask 576 with sidewalls that define an opening for exposing portions of the thyristor device, which may overlap a portion of second wordline 74 and a portion of raised silicon 300 of the anode-emitter. While using the patterned photoresist 576 as a mask, lifetime adjustment impurity species may be implanted into regions 577 associated with a portion of the anode-emitter and across its interface 101 to a portion of N-base 98. The impurity implant might also embed a portion 579 of the polysilicon of second wordline 74. It will be noted that first spacer 64' having a peripheral edge extending across a portion of N-base 98, might thus prevent the implant of the lifetime adjustment impurities from overlapping interface 99 from the N-base 98 to P-base 82. Accordingly, while the lifetime adjustment implant region 577 may affect leakage characteristics of interface 101 from N-base 98 to anode-emitter 200; the integrity of its opposite interface 99 might otherwise be preserved.

Moving forward in accordance with a further embodiment of the present invention, with reference to FIG. 14, carrier lifetime adjustment species or junction leakage implant may be positioned at an alternative interface region 677 between anode-emitter 600 and N-base 398. After forming an N-base region 398 to extend beneath a portion of the lateral shoulder 35 of dielectric mask 64", an opposite conductivity shallow implant may be performed to form shallow anode-emitter 600 in N-well 398. Accordingly, by such shallow implant, an interface between anode-emitter 600 and N-base 398 may extend laterally to isolation trench 212. After the shallow implant, photoresist may be layered and patterned to define mask 676 over the majority of the thyristor memory cell structure. Sidewalls 677 of the mask may define an opening for establishing regions in which to implant the carrier lifetime (or leakage adjustment) species. The implant may use an energy level sufficient to embed the species into a buried implant region 679 that overlaps the interface between anode-emitter 600 and N-base 398 and at a lateral position proximate isolation trench 212. This leakage implant may be performed using a substantially orthogonal angle of incidence so as to form implant region 679 substantially aligned relative to sidewall 677 of mask 676. After defining the lifetime adjustment species region 679, mask 676 may be removed and epitaxial material 300 may be formed selectively over the exposed silicon regions of the SOI substrate 59. Silicide might also be formed thereover similarly as described earlier herein.

In accordance with yet another embodiment of the present invention, with reference to FIG. 15, dielectric of the isolation trench 212 may be removed for lowering its level and re-defining an alternative depth or floor 612 of the isolation trench. The floor 612 of the isolation trench may be lowered sufficiently to expose ends 622 of anode-emitter 600 facing the trench and laterally distant second wordline 74. Silicide may then be formed to diffuse metal into exposed surface regions of the silicon, including the ends 622 facing the newly defined isolation trench. The metal diffusion might also overlap the interface between the shallow implant anode-emitter 600 and N-base 398. As illustrated in FIG. 15, various alternative depths 612 might be formed for the isolation trench.

While certain exemplary features of the embodiments of the invention have been illustrated and described above, many modifications, substitutions, changes and equivalents may be available to those skilled in the art. It is, therefore, to be understood that the appended claims are intended to cover all such embodiments and changes as fall within the spirit of this invention.

What is claimed is:

1. A method of semiconductor processing to form a thyristor memory device, comprising:
   forming a wordline over a layer of silicon, the silicon of a first-type conductivity;
   forming first dielectric over the wordline and the layer of silicon;
   patterning the first dielectric to define a salicide mask comprising a first part over at least a portion of the wordline, a second part contiguous with the first part and conformal to a sidewall of the wordline, and a third part contiguous with the second part as a shoulder that extends outwardly from the wordline and across a portion of the layer of silicon;

implanting dopant of second-type conductivity in the layer of silicon using an angled implant relative to the surface of the silicon and in self-alignment with the mask; and after the implanting of the second-type conductivity dopant, implanting dopant of first-type conductivity in the layer of silicon using a substantially orthogonal implant angle and self-aligned with the salicide mask.

2. The method of claim 1, further comprising, after the first and second-type conductivity implants, siliciding exposed regions of silicon as defined by the salicide mask.

3. The method of claim 2, further comprising:
defining a cathode/anode-emitter region in the layer of silicon by implanting dopant of the second-type conductivity into regions of the layer of silicon that neighbor the wordline and at a side thereof opposite to the extended shoulder of the mask;
the implanting to define the cathode/anode-emitter region comprising:
using a mask defined at least in part by the wordline; and
accelerating the second-type dopant with a substantially orthogonal angle of incidence toward the layer of silicon.

4. The method of claim 3, in which the implanting of the second-type conductivity dopant comprises:
controlling at least one parameter of the group consisting of the acute angle of incidence, the implant energy, a lateral width of the shoulder and the implant species of the implanting to form a lateral extent for the second-type conductivity dopant as a first base region of the thyristor beneath the shoulder of the salicide mask; and
defining in part a boundary to a second base of the thyristor, the second base region comprising material of the layer of silicon of the first-type conductivity disposed between the first base region and the cathode/anode-emitter.

5. The method of claim 4, further comprising forming an access transistor in series with and coupled to the thyristor's cathode/anode-emitter region.

6. The method of claim 4, in which the patterning of the conformal layer of dielectric comprises forming the width of the shoulder of the mask with a lateral extend that is greater than its conformal thickness.

7. The method of claim 6, in which the patterning of the dielectric comprises:
forming a conformal layer of first dielectric over the wordline and layer of silicon;
forming a conformal layer of second dielectric over the layer of nitride, the second dielectric selectively etchable relative to the first dielectric;
anisotropically etching the second dielectric until exposing portions of the first dielectric while using the first dielectric as an etch-stop, the anisotropically etching to form a spacer of the second dielectric against a portion of the first dielectric and along a sidewall of the wordline; and
using the spacer and the portion of the first dielectric together during the angled implant.

8. The method of claim 7, in which the first and second dielectric comprise nitride and oxide respectively.

9. The method of claim 8, further comprising anisotropically etching the layer of nitride while using the oxide spacer as the mask and defining the lateral extent for the shoulder of the salicide mask.

10. The method of claim 8, further comprising performing the implant of the first-type conductivity dopant while using the orthogonal angle of incidence and while using the oxide spacer and the nitride layer together as a mask to define an anode/cathode-emitter region for the thyristor.

11. The method of claim 2, in which the wordline is formed with polysilicon, and the siliciding comprises siliciding exposed regions of the polysilicon, the exposed regions defined at least in part by walls of the mask.

12. The method of claim 2, further comprising:
before the siliciding and after the implanting of second-type conductivity dopant, growing epitaxial silicon over exposed regions of the layer of silicon.

13. The method of claim 12, in which the siliciding comprises diffusing metal into a surface region of the epitaxial silicon to form a silicide.

14. The method of claim 13, in which:
the implanting of the first-type conductivity dopant forms an anode-emitter region of the thyristor;
the growing of the epitaxial silicon forms epitaxial silicon over the anode-emitter region; and
the siliciding forms silicide on the epitaxial silicon over the anode-emitter region;
the method further comprising forming a contact on the silicide over the anode-emitter region, the contact for receiving a reference voltage.

15. The method of claim 14, further comprising:
implanting second-type conductivity dopant into a region of the layer of silicon aligned with a side of the wordline distal the anode-emitter and forming a cathode-emitter of the thyristor; and
forming an access transistor in series with the thyristor and coupled to the cathode-emitter.

16. The method of claim 15, in which the forming the access transistor comprises:
forming one of a drain and source for the access transistor in common with the thyristor's cathode-emitter; and
forming a bitline in electrical communication with the other one of the drain and the source of the access transistor.

17. A method of semiconductor processing comprising:
forming cathode/anode-emitter, first base, second base and anode/cathode-emitter regions to define a thyristor in a layer of silicon over an insulator;
forming a wordline over at least a portion of the first base region;
forming a salicide mask against a sidewall of the wordline and over a width of the region for the second base at the surface of the layer of silicon;
the second base region and the anode-emitter regions each formed with an alignment related at least in part to the salicide mask; and
implanting carrier lifetime adjustment species into one of the emitter base junction regions aligned at least in part to the salicide mask.

18. The method of claim 17, in which forming the salicide mask comprises covering the surface of the layer of silicon to overlap the width of the base region.

19. The method of claim 17, further comprising forming epitaxial silicon over exposed regions of the layer of silicon, the exposed regions to include the anode/cathode-emitter region and defined in part by the salicide mask.

20. The method of claim 19, further comprising forming silicide over exposed silicon defined in part by the salicide mask.

21. The method of claim 20, in which the implanting of the carrier lifetime adjustment species is performed after forming the epitaxial silicon and before forming the silicide.

22. The method of claim 21, in which the implanting the carrier lifetime adjustment species comprises using an implant energy to implant an upper region of the layer of silicon of a depth less than its thickness.

23. The method of claim 22, in which the implanting the carrier lifetime adjustment species comprises overlapping the interface between the anode/cathode-emitter and the second base with at least some of the implant species.

24. The method of claim 23, in which the implanting the carrier lifetime adjustment species defines a region thereof that remains clear of the junction between the first base and the second base.

25. The method of claim 23, further comprising using at least one particle ion species of the group consisting of column IV, column VIII or refractory metal elements to influence a leakage characteristic of the interface.

26. The method of claim 23, in which the implanting the carrier lifetime adjustment species further comprising accelerating the species toward the layer of silicon with an acute angel of incidence.

27. A method of forming a thyristor memory device, comprising:
   forming first and second wordlines over a layer of silicon;
   forming source and drain regions for an access transistor in the layer of silicon about respective sides of the first wordline, the source and the drain regions formed to define a channel region therebetween and beneath the first wordline;
   forming first and second spacers against opposite sidewalls of the second wordline; the
      forming the first and the second spacers comprising:
         forming the first spacer against an anode/cathode-emitter sidewall of the second wordline,
         forming the second spacer against a cathode/anode-emitter sidewall of the second wordline opposite the anode/cathode-emitter sidewall, and
         forming the first spacer with a width that extends over the layer of silicon and outward from the second wordline by a magnitude greater than that for the second spacer;
   forming a cathode/anode emitter region for a thyristor in the layer of silicon aligned to the second spacer against the cathode/anode-emitter sidewall of the second wordline, and in common with the one of the source and drain regions for the accesses transistor;
   forming a first base region for the thyristor in the layer of silicon beneath the first spacer and aligned relative thereto; and
   forming an anode/cathode-emitter region for the thyristor in the layer of silicon laterally outward from and aligned relative to the first spacer.

28. The method of 27, in which the forming the first base region and the forming the cathode/anode-emitter region comprises defining a second base region for the thyristor therebetween and with a width at the surface of the layer of silicon that is substantially beneath the second wordline.

29. The method of claim 27, further comprising forming the layer of silicone of thickness less than 50 nm over an insulator.

30. The method of claim 27, in which the forming the first base region comprises:
   implanting second-type conductivity dopant into the layer of silicon, the second-type conductivity opposite a first-type conductivity of the layer of silicon;
   using the first spacer as part of a mask during the implant; and
   penetrating regions of the layer of silicon beneath the first spacer with some of the second-type conductivity dopant.

31. The method of claim 30, further comprising using an angled implant for the dopant of the second-type conductivity.

32. The method of claim 31, in which the implanting with the second-type conductivity dopant comprises using an implant energy to penetrate full depth of exposed regions of the layer of layer of silicon.

33. The method of claim 32, in which the formation of the anode/cathode-emitter region comprises:
   implanting an exposed region of the layer of silicon with first-type conductivity dopant;
   defining the exposed region at least in part by the first spacer; and
   using a substantially orthogonal angled implant for the implanting of the first-type conductivity dopant.

34. The method of claim 33, in which the implanting with the first-type conductivity dopant comprises:
   using an implant energy to penetrate a partial depth of the layer of silicon; and
   defining a sublayer of the second-type conductivity between the anode/cathode-emitter and the insulator.

35. The method of claim 33, further comprising:
   forming an isolation trench between regions of the layer of silicon;
   the formation of the anode/cathode-emitter in the layer of silicon to establish a sidewall thereof facing the trench; and
   forming insulating material in at least a portion of the isolation trench;
   a sidewall of the trench defined at least in part by the anode/cathode-emitter.

36. The method of claim 35, in which the forming the isolation trench comprises:
   forming a sidewall in the layer of silicon;
   exposing an upper layer portion in the layer of silicon for the anode/cathode-emitter; and
   exposing a lower layer portion in the layer of silicon of the second-type conductivity beneath the anode/cathode-emitter.

37. The method of claim 35, further comprising:
   diffusing metal into exposed surface regions of the layer of silicon to form a silicide; and
   defining the exposed surface regions at least in part by the first spacer and the partial fill of insulating material.

38. The method of claim 37, further comprising:
   forming epitaxial silicon on the anode-emitter region of the layer of silicon and between a peripheral edge of the first spacer and the isolation trench; and
   performing the metal diffusion to form the silicide after the formation of the epitaxial silicon and to silicide a surface region of the epitaxial silicon.

39. The method of claim 38, in which the metal diffusion comprises:
   siliciding exposed sidewalls of the layer of silicon facing the isolation trench; and
   diffusing a portion of the metal to a region of the sublayer proximate the isolation trench.

* * * * *